(12) United States Patent
Yang

(10) Patent No.: US 12,029,038 B2
(45) Date of Patent: Jul. 2, 2024

(54) THREE-DIMENSIONAL MEMORY DEVICE HAVING POCKET STRUCTURE IN MEMORY STRING AND METHOD FOR FORMING THE SAME

(71) Applicant: YANGTZE MEMORY TECHNOLOGIES CO., LTD., Wuhan (CN)

(72) Inventor: Yonggang Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 396 days.

(21) Appl. No.: 17/535,862

(22) Filed: Nov. 26, 2021

(65) Prior Publication Data
US 2022/0367508 A1 Nov. 17, 2022

Related U.S. Application Data

(60) Division of application No. 16/751,130, filed on Jan. 23, 2020, now Pat. No. 11,469,243, which is a
(Continued)

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02636* (2013.01); *H01L 21/823487* (2013.01); *H01L 29/165* (2013.01)

(58) Field of Classification Search
CPC ........ H10B 43/35; H10B 43/27; H10B 41/35; H10B 41/27; H01L 21/823487; H01L 21/02636; H01L 29/165
See application file for complete search history.

(56) References Cited

U.S. PATENT DOCUMENTS

| 9,748,268 B1 | 8/2017 | Arai |
| 2012/0003828 A1 | 1/2012 | Chang et al. |

(Continued)

FOREIGN PATENT DOCUMENTS

| CN | 102760738 A | 10/2012 |
| CN | 103066076 A | 4/2013 |

(Continued)

OTHER PUBLICATIONS

International Search Report issued in corresponding International Application No. PCT/CN2019/112428, dated Jul. 20, 2020, 4 pages.

*Primary Examiner* — Sonya McCall-Shepard
(74) *Attorney, Agent, or Firm* — BAYES PLLC

(57) ABSTRACT

In one aspect, a method for forming a 3D memory device is disclosed. A selective epitaxial sacrificial layer is formed above a substrate, and a dielectric stack is formed above the selective epitaxial sacrificial layer. A first opening extending vertically through the dielectric stack and the selective epitaxial sacrificial layer is formed. A portion of the first opening extending vertically through the selective epitaxial sacrificial layer is enlarged. A memory film and a semiconductor channel are subsequently formed in this order along sidewalls and a bottom surface of the first opening. The selective epitaxial sacrificial layer is removed to form a cavity exposing a portion of the memory film. The portion of the memory film exposed in the cavity is removed to expose a portion of the semiconductor channel. A selective epitaxial layer is epitaxially grown from the substrate to fill the cavity and be in contact with the portion of the semiconductor channel.

10 Claims, 18 Drawing Sheets

Related U.S. Application Data continuation of application No. PCT/CN2019/112428, filed on Oct. 22, 2019.

(51) Int. Cl.
    *H01L 21/8234*     (2006.01)
    *H01L 29/165*     (2006.01)
    *H10B 43/35*     (2023.01)

(56) References Cited

U.S. PATENT DOCUMENTS

| | | |
|---|---|---|
| 2012/0009747 A1 | 1/2012 | Kang et al. |
| 2012/0273865 A1 | 11/2012 | Lee et al. |
| 2012/0280304 A1 | 11/2012 | Lee et al. |
| 2013/0009239 A1 | 1/2013 | Lee et al. |
| 2013/0100741 A1 | 4/2013 | Choi et al. |
| 2014/0087534 A1 | 3/2014 | Choe et al. |
| 2014/0273373 A1 | 9/2014 | Makala et al. |
| 2015/0076584 A1 | 3/2015 | Pachamuthu et al. |
| 2015/0137209 A1 | 5/2015 | Lee |
| 2015/0200203 A1 | 7/2015 | Jang et al. |
| 2015/0357413 A1 | 12/2015 | Zhang et al. |
| 2017/0234815 A1 | 8/2017 | Jones et al. |
| 2018/0122906 A1 | 5/2018 | Yu et al. |
| 2018/0342524 A1 | 11/2018 | Ryckaert et al. |
| 2021/0057445 A1 | 2/2021 | Kim et al. |
| 2021/0066460 A1 | 3/2021 | Haller |

FOREIGN PATENT DOCUMENTS

| | | |
|---|---|---|
| CN | 105355602 A | 2/2016 |
| CN | 105470260 A | 4/2016 |
| CN | 107871744 A | 4/2018 |
| JP | 2019161012 A | 9/2019 |
| JP | 2019161015 A | 9/2019 |
| JP | 2019161110 A | 9/2019 |
| TW | 201913965 A | 4/2019 |
| TW | 201941403 A | 10/2019 |
| WO | 2019052127 A1 | 3/2019 |

THREE-DIMENSIONAL MEMORY DEVICE HAVING POCKET STRUCTURE IN MEMORY STRING AND METHOD FOR FORMING THE SAME

CROSS-REFERENCE TO RELATED APPLICATIONS

This application is a divisional of U.S. application Ser. No. 16/751,130, filed on Jan. 23, 2020, entitled "THREE-DIMENSIONAL MEMORY DEVICE HAVING POCKET STRUCTURE IN MEMORY STRING AND METHOD FOR FORMING THE SAME," which is a continuation of International Application No. PCT/CN2019/112428, filed on Oct. 22, 2019, entitled "THREE-DIMENSIONAL MEMORY DEVICE HAVING POCKET STRUCTURE IN MEMORY STRING AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having a pocket structure in memory strings and methods for forming the same are disclosed herein.

In one example, a 3D memory device includes a substrate, a selective epitaxial layer on the substrate, a memory stack including interleaved conductive layers and dielectric layers on the selective epitaxial layer, and a memory string including a channel structure extending vertically in the memory stack and a pocket structure extending vertically in the selective epitaxial layer. The memory string includes a semiconductor channel extending vertically in the channel structure, and extending vertically and laterally in the pocket structure and in contact with the selective epitaxial layer.

In another example, a 3D memory device includes a substrate, a selective epitaxial layer on the substrate, a memory stack including interleaved conductive layers and dielectric layers on the selective epitaxial layer, and a memory string including a channel structure extending vertically in the memory stack and a pocket structure extending vertically in the selective epitaxial layer. A lateral dimension of the channel structure is not greater than a lateral dimension of the pocket structure.

In still another example, a method for forming a 3D memory device is disclosed. A selective epitaxial sacrificial layer is formed above a substrate, and a dielectric stack is formed above the selective epitaxial sacrificial layer. A first opening extending vertically through the dielectric stack and the selective epitaxial sacrificial layer is formed. A portion of the first opening extending vertically through the selective epitaxial sacrificial layer is enlarged. A memory film and a semiconductor channel are subsequently formed in this order along sidewalls and a bottom surface of the first opening. The selective epitaxial sacrificial layer is removed to form a cavity exposing a portion of the memory film. The portion of the memory film exposed in the cavity is removed to expose a portion of the semiconductor channel. A selective epitaxial layer is epitaxially grown from the substrate to fill the cavity and be in contact with the portion of the semiconductor channel.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
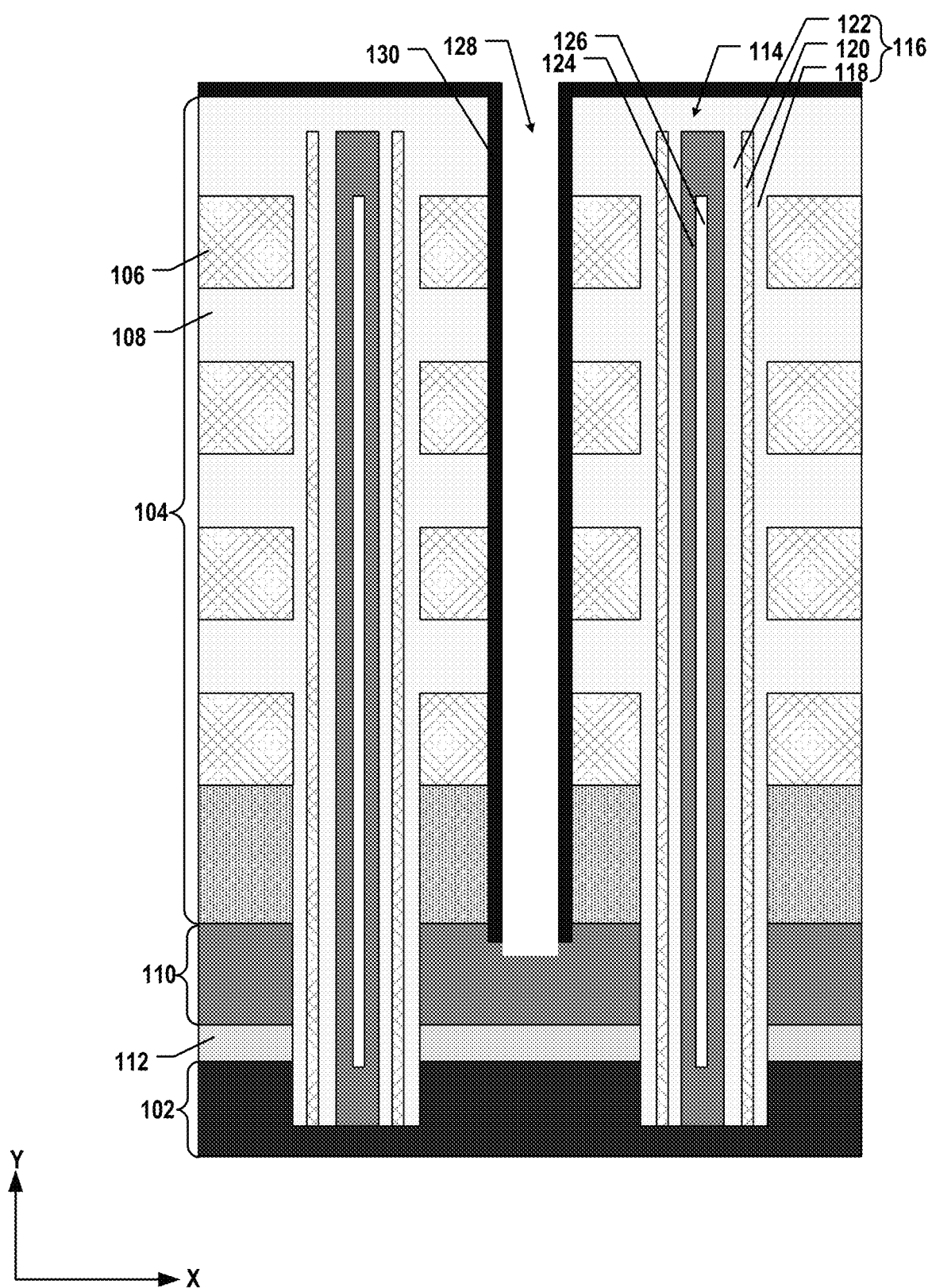
FIGS. 1A-1C illustrate an exemplary fabrication process for forming a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, a semiconductor plug is selectively grown to surround the sidewalls of NAND memory strings. Compared with another type of semiconductor plug that is formed at the lower end of the NAND memory string, the formation of the sidewall semiconductor plug avoids the etching of the memory film and semiconductor channel at the bottom surface of channel holes, thereby increasing the process window, in particular when fabricating 3D NAND memory devices with advanced technologies, such as having 96 or more levels with a multi-deck architecture. However, as some processes for forming the sidewall semiconductor plug need to etch bottom sacrificial layer and the memory film to expose the semiconductor channel contacting the sidewall semiconductor plug, the removal of the sacrificial layer and the memory film beneath the dielectric stack with increasing number of levels weakens the bottom structure of the NAND memory string, which can cause peeling issue or even collapse.

Figure 1B:
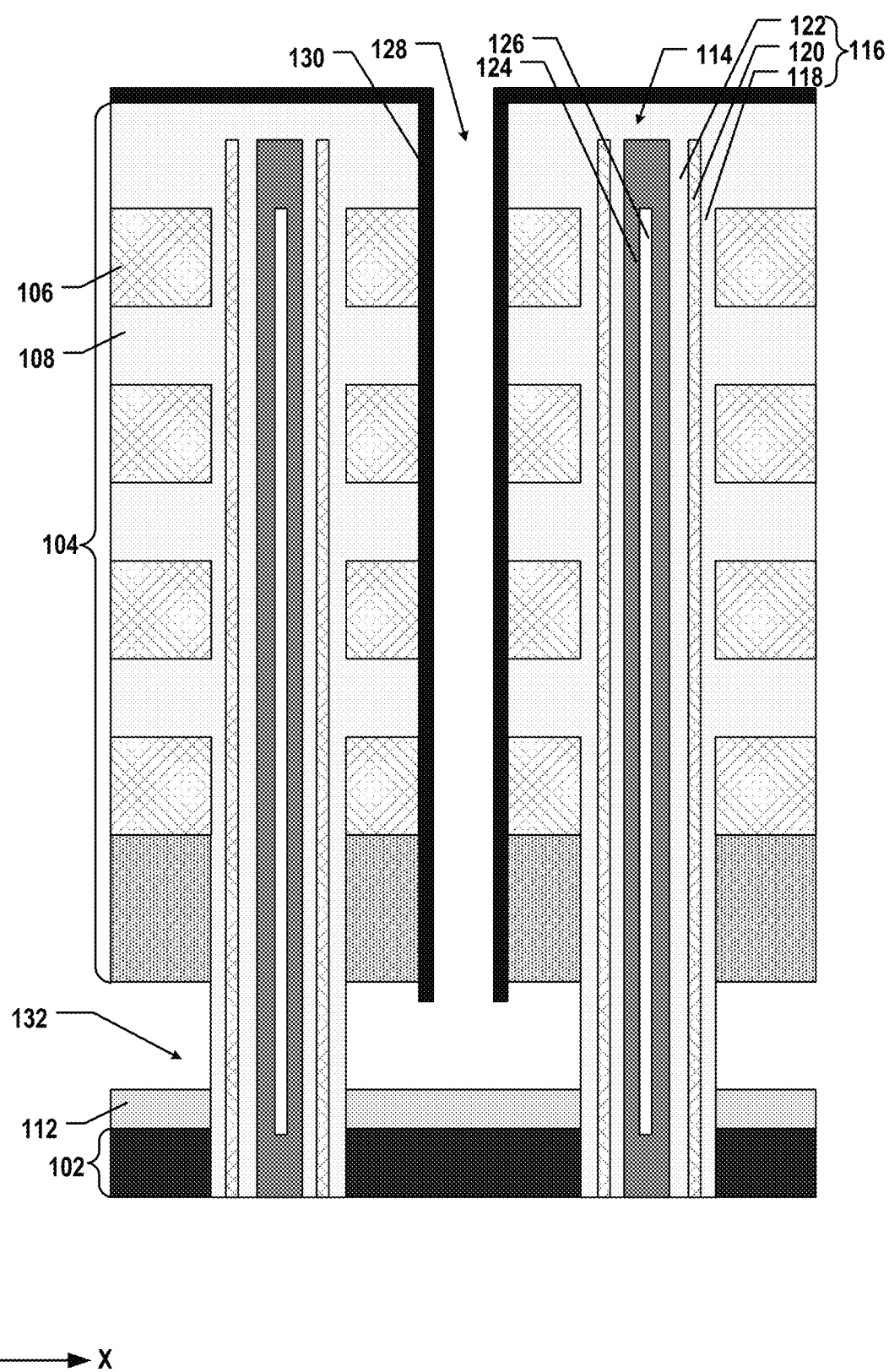
Figure 1C:
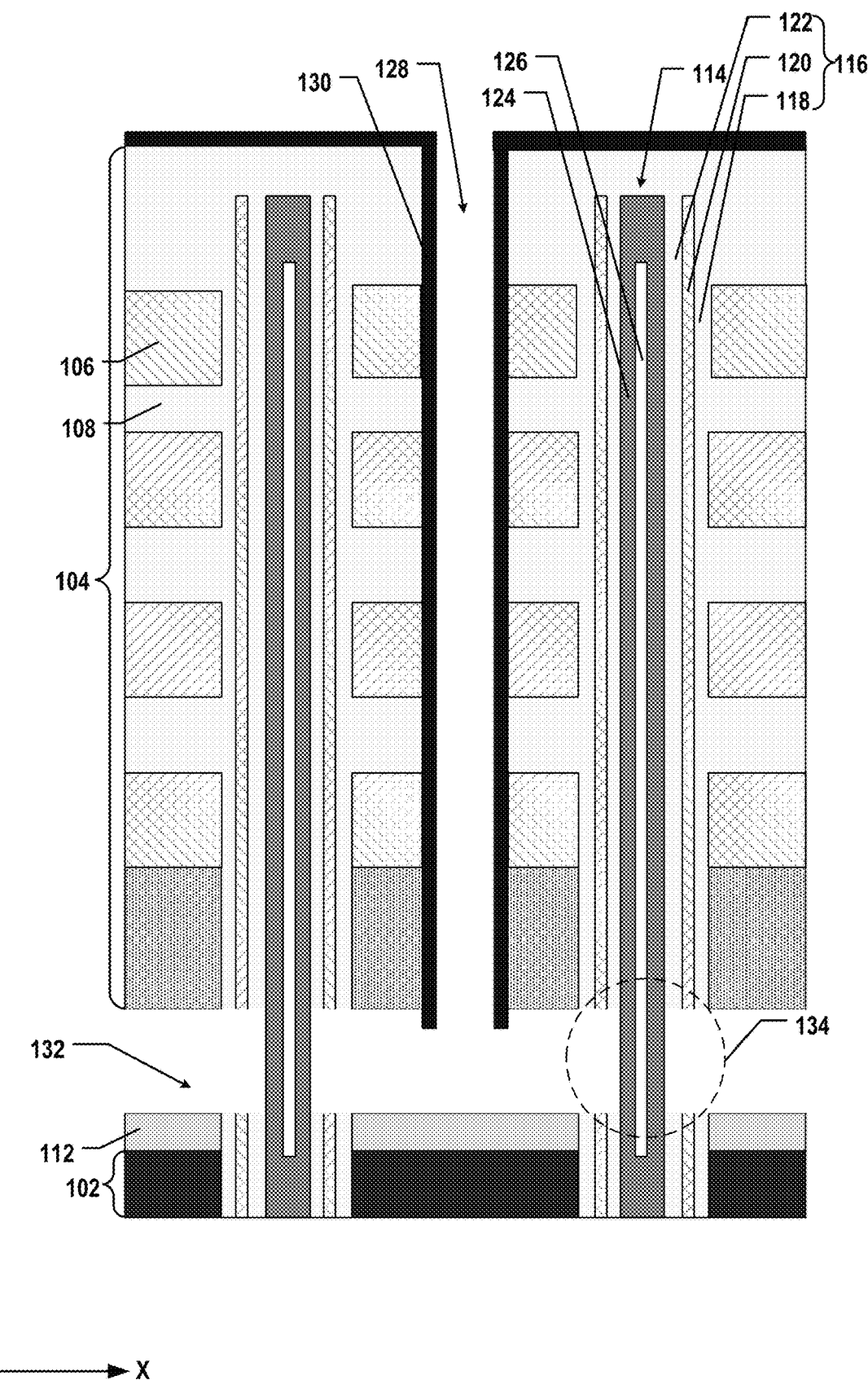

For example, FIGS. 1A-1C illustrate an exemplary fabrication process for forming a 3D memory device. As shown in FIG. 1A, a dielectric stack 104 includes interleaved gate sacrificial layers 106 and dielectric layers 108 formed above a substrate 102. Once all the fabrication processes are finished, dielectric stack 104 is replaced with a memory stack by a gate replacement process, which replaces each gate sacrificial layer 106 with a conductive layer. A selective epitaxial sacrificial layer 110 and a pad oxide layer 112 are formed vertically between dielectric stack 104 and substrate 102. A NAND memory string 114 extends vertically in dielectric stack 104 and through selective epitaxial sacrificial layer 110 and a pad oxide layer 112 into substrate 102. NAND memory string 114 includes a memory film 116 including a blocking layer 118, a storage layer 120, and a tunneling layer 122 along the sidewalls of NAND memory string 114. NAND memory string 114 further includes semiconductor channel 124 and a cap layer 126 surrounded by memory film 116.

As shown in FIG. 1A, a slit 128 is formed vertically through dielectric stack 104 into selective epitaxial sacrificial layer 110. A protection layer 130 is formed to cover the sidewalls of slit 128. The bottom surface of protection layer 130 is removed to expose part of selective epitaxial sacrificial layer 110. As shown in FIG. 1B, the fabrication process proceeds, such that selective epitaxial sacrificial layer 110 (as shown in FIG. 1A) is removed through slit 128 to form a cavity 132 exposing a portion of memory film 116. As shown in FIG. 1C, the fabrication process proceeds, such that the portion of memory film 116 exposed in cavity 132 is removed to expose a portion of semiconductor channel 124 (as circled in 134). Before cavity 132 is filled up with a selective epitaxial layer (not shown) in the following processes, portion 134 becomes a weak point (hereafter "weak point 134") as it needs to support the entire structure above, e.g., dielectric stack 104, which may cause peeling issues or even collapse to reduce the yield.

Various embodiments in accordance with the present disclosure provide an improved structure with higher mechanical strength and fabrication method thereof for supporting the upper structure between the removal of the selective epitaxial sacrificial layer and the formation of the selective epitaxial layer during the fabrication processes. In some embodiments, a pocket structure of the 3D NAND memory string extending in the selective epitaxial sacrificial layer is formed by etching back the selective epitaxial sacrificial layer. The semiconductor channel and cap layer in the pocket structure can have a larger dimension compared with their counterparts in weak point 134 of FIG. 1C to provide stronger mechanical supports, thereby reducing the risk of collapse and increasing the yield. Moreover, no additional fabrication processes besides the etching back process are needed to increase the fabrication cost and complexity.

Figure 2:
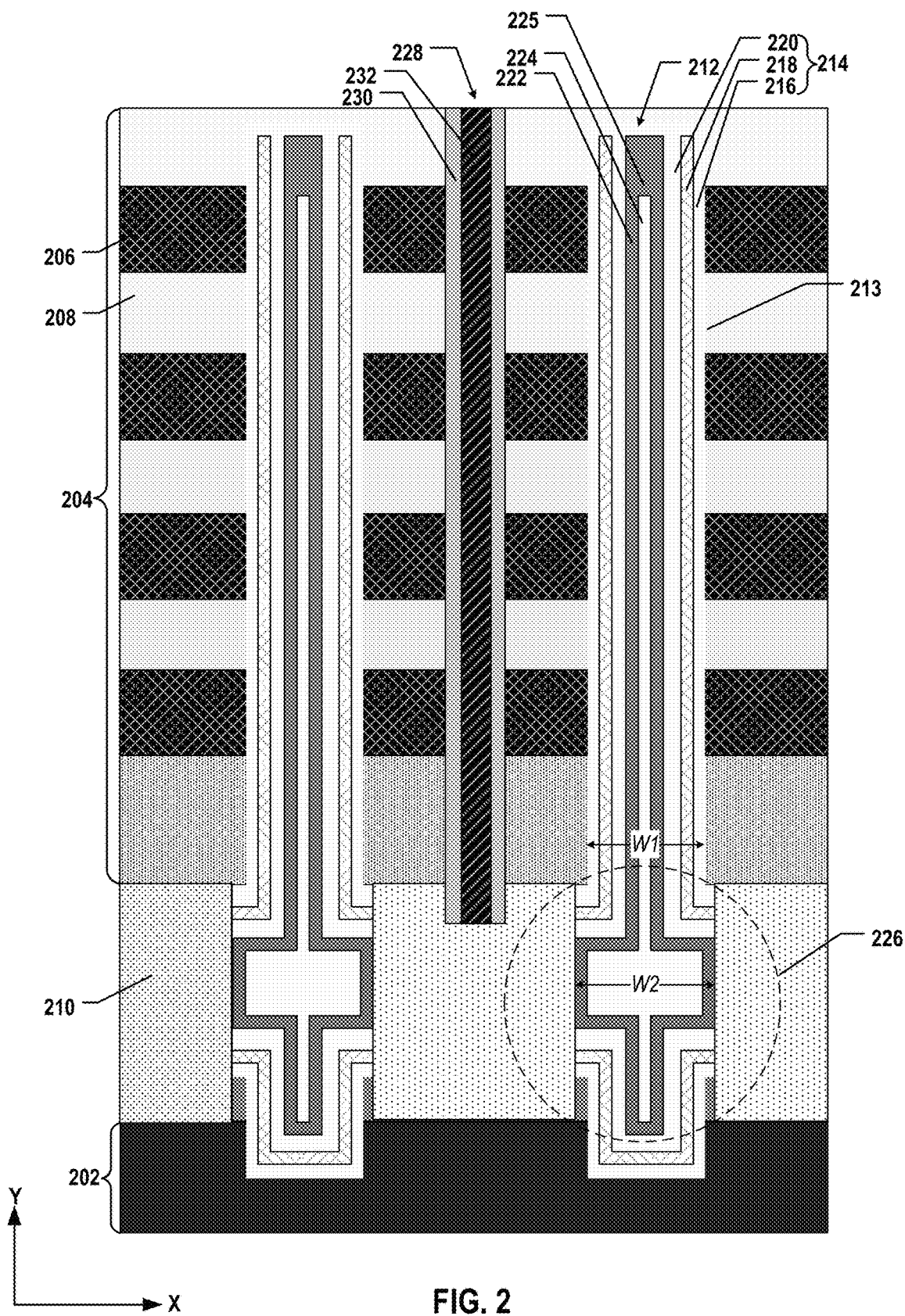
FIG. 2 illustrates a cross-section of an exemplary 3D memory device having a pocket structure in a memory string, according to some embodiments of the present disclosure.

FIG. 2 illustrates a cross-section of an exemplary 3D memory device 200 having a pocket structure in a memory string, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. It is noted that x and y axes are included in FIG. 2 to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in they-direction (i.e., the vertical direction) when the substrate is positioned in the lowest plane of the 3D memory device in they-direction. The same notion for describing the spatial relationship is applied throughout the present disclosure.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

As shown in FIG. 2, 3D memory device 200 also includes a selective epitaxial layer 210 on substrate 202. Selective epitaxial layer 210 can be an example of the "sidewall semiconductor plug" as described above. Selective epitaxial layer 210 can include a semiconductor material, such as silicon, which is epitaxially grown upwards from substrate 202. In some embodiments, substrate 202 is a silicon substrate, and selective epitaxial layer 210 includes single crystalline silicon, the same material of substrate 202. In other words, selective epitaxial layer 210 can include an epitaxially-grown semiconductor layer that is the same material as the material of substrate 202. In some embodiments, selective epitaxial layer 210 acts as at least part of the array common source (ACS) of an array of NAND memory strings 212.

In some embodiments, 3D memory device 200 is a NAND Flash memory device in which memory cells are provided in the form of an array of NAND memory strings 212 extending vertically above substrate 202. The memory array device can include NAND memory strings 212 that extend through a plurality of pairs each including a conductive layer 206 and a dielectric layer 208 (referred to herein as "conductive/dielectric layer pairs"). The stacked conductive/dielectric layer pairs are also referred to herein as a "memory stack" 204. The number of the conductive/dielectric layer pairs in memory stack 204 (e.g., 32, 64, 96, 128, 160, 192, 256, etc.) determines the number of memory cells in 3D memory device 200. Memory stack 204 can include a plurality of interleaved conductive layers 206 and dielectric layers 208 on selective epitaxial layer 210. Conductive layers 206 and dielectric layers 208 in memory stack 204 can alternate in the vertical direction. Conductive layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof. Although not shown in FIG. 2, it is understood that in some embodiments, memory stack 204 may have a multi-deck architecture, such as a dual-deck architecture that includes a lower memory deck and an upper memory deck on lower memory deck.

As shown in FIG. 2, NAND memory string 212 can include a channel structure 213 extending vertically in memory stack 204 and a pocket structure 226 extending in selective epitaxial layer 210 and below channel structure 213. NAND memory string 212 can include a channel hole filled with semiconductor material(s) (e.g., as a semiconductor channel 222) and dielectric material(s) (e.g., as a memory film 214). In some embodiments, semiconductor channel 222 includes silicon, such as amorphous silicon, polysilicon, or single crystalline silicon. In one example, semiconductor channel 222 includes polysilicon. In some embodiments, memory film 214 is a composite layer including a tunneling layer 220, a storage layer 218 (also known as a "charge trap layer"), and a blocking layer 216. The remaining space of the channel hole can be partially or fully filled with a cap layer 224 including dielectric materials, such as silicon oxide. Channel structure 213 can have a cylinder shape (e.g., a pillar shape). Cap layer 224, semiconductor channel 222, tunneling layer 220, storage layer 218, and blocking layer 216 are arranged radially from the center toward the outer surface of the pillar in this order, according to some embodiments. Tunneling layer 220 can include silicon oxide, silicon oxynitride, or any combination thereof. Storage layer 218 can include silicon nitride, silicon oxynitride, or any combination thereof. Blocking layer 216 can include silicon oxide, silicon oxynitride, high dielectric constant (high-k) dielectrics, or any combination thereof. In one example, memory film 214 can include a composite layer of silicon oxide/silicon oxynitride/silicon oxide (ONO).

In some embodiments, conductive layer 206 (each being part of a word line) in memory stack 204 functions as a gate conductor of memory cells in NAND memory string 212. Conductive layer 206 can include multiple control gates of multiple NAND memory cells and can extend laterally as a word line ending at the edge of memory stack 204 (e.g., in a staircase structure of memory stack 204). In some embodiments, memory cell transistors in NAND memory string 212 include gate conductors (i.e., parts of conductive layers 206 that abut channel structure 213) made from W, adhesion layers (not shown) including titanium/titanium nitride (Ti/TiN) or tantalum/tantalum nitride (Ta/TaN), gate dielectric layers (not shown) made from high-k dielectric materials, and channel structure 213 described above in detail.

In some embodiments, NAND memory string 212 further includes a channel plug 225 in an upper portion (e.g., at the upper end) of NAND memory string 212. As used herein, the "upper end" of a component (e.g., NAND memory string 212) is the end farther away from substrate 202 in the y-direction, and the "lower end" of the component (e.g., NAND memory string 212) is the end closer to substrate 202 in they-direction when substrate 202 is positioned in the lowest plane of 3D memory device 200. Channel plug 225 can be the upper end of semiconductor channel 222 or a separate structure in contact with the upper end of semiconductor channel 222. Channel plug 225 can include semiconductor materials (e.g., polysilicon). In some embodiments, channel plug 225 functions as the drain of NAND memory string 212.

Different from FIG. 1C in which NAND memory string 114 has weak point 134 extending in cavity 132 in which the selective epitaxial layer is to be formed, NAND memory string 114 can include pocket structure 226 extending in selective epitaxial layer 210 to provide stronger mechanical supports to the upper structures, e.g., memory stack 204, during the fabrication processes. Different from FIG. 1C in which NAND memory string 114 includes only a portion of semiconductor channel 124 (without memory film 116) extending vertically in weak point 134, NAND memory string 114 can include a portion of semiconductor channel 124 extending vertically and laterally in pocket structure 226. As a result, different from FIG. 1C in which the lateral dimension (e.g., the width in the x-direction) of NAND memory string 114 at weak point 134 is smaller than the lateral dimension of NAND memory string 114 above, the lateral dimension W1 (e.g., the width in the x-direction) of channel structure 213 in FIG. 2 is not greater than the lateral dimension W2 (e.g., the width in the x-direction) of pocket structure 226, according to some embodiments. In some embodiments, the lateral dimension W1 of channel structure 213 in FIG. 2 is nominally the same as the lateral dimension W2 of pocket structure 226. That is, NAND memory string 212 may have a uniform diameter in the vertical direction in both channel structure 213 and pocket structure 226.

As shown in FIG. 2, semiconductor channel 222 in 3D memory device 200 can extend vertically in channel structure 213, and extend vertically and laterally in pocket structure 226 and in contact with selective epitaxial layer 210. In some embodiments, selective epitaxial layer 210 include single crystalline silicon, and semiconductor channel 222 includes polysilicon. Part of semiconductor channel 222 in pocket structure 226 can be in contact with selective epitaxial layer 210 to form an electrical connection between NAND memory string 212 and selective epitaxial layer 210. In some embodiments, semiconductor channel 222 extends laterally in pocket structure 226 for a distance that is nominally the same as the thickness of memory film 214 (i.e., the total thickness of blocking layer 216, storage layer 218, and tunneling layer 220). For example, semiconductor channel 222 may extend laterally in pocket structure 226 for about 20 nm, such as 20 nm. As a result, the distance between semiconductor channel 222 formed on opposite sidewalls in pocket structure 226 is greater than the distance between semiconductor channel 222 formed on opposite sidewalls in channel structure 213, according to some embodiments. In some embodiments, semiconductor channel 222 is flat at the lower end of NAND memory string 212 due to the usage of selective epitaxial layer 210 as a sidewall semiconductor plug instead of a semiconductor plug underneath, which requires the removal of at least part of semiconductor channel 222 at the lower end of the NAND memory string.

As shown in FIG. 2, cap layer 224 of 3D memory device 200 surrounded by semiconductor channel 222 has a lateral dimension in pocket structure 226 that is greater than a lateral dimension in channel structure 213, according to some embodiments. Different from FIG. 1C in which cap layer 126 has a uniform lateral dimension in the vertical dimension, cap layer 224 of 3D memory device 200 can become thicker in pocket structure 226 to provide enhanced mechanical strength, along with expanded semiconductor channel 222, to support the upper structures, e.g., memory stack 204.

In some embodiments, memory film 214 in 3D memory device 200 is laterally between memory stack 204 and semiconductor channel 222 in channel structure 213. As shown in FIG. 2, memory film 214 can extend vertically in channel structure 213, and extend laterally in pocket structure 226. Different from FIG. 1C in which memory film 116 is removed in weak point 134, at least part of memory film 214 extending laterally can remain in pocket structure 226 to provide further supports to the upper structures, e.g., memory stack 204.

In some embodiments, 3D memory device 200 further includes a source contact structure 228. Source contact structure 228 can extend vertically through the conductive/dielectric layer pairs in memory stack 204 and in contact with selective epitaxial layer 210. Source contact structure 228 can also extend laterally (e.g., in the direction perpendicular to x- and y-directions) to separate memory stack 204 into multiple blocks. Source contact structure 228 can include an opening (e.g., a slit) filled with conductive materials including, but not limited to, W, Co, Cu, Al, silicides, or any combination thereof, to form a source conductor 232. Source contact structure 228 can further include a spacer 230 having dielectric materials, such as silicon oxide, laterally between source conductor 232 and memory stack 204 to electrically insulate source conductor 232 from surrounding conductive layers 206 in memory stack 204. As a result, multiple source contact structures 228 can separate 3D memory device 200 into multiple memory blocks and/or memory fingers. In some embodiments, source conductor 232 includes polysilicon in its lower portion contacting selective epitaxial layer 210, e.g., including single crystalline silicon, and a metal (e.g., W) in its upper portion contacting a metal interconnect (not shown), to form an electrical connection between selective epitaxial layer 210 (e.g., as the source of NAND memory string 212) and the metal interconnect.

FIGS. 3A-3L illustrate an exemplary fabrication process for forming a 3D memory device having a pocket structure in a memory string, according to some embodiments of the present disclosure. FIGS. 4A-4B illustrate a flowchart of an exemplary method 400 for forming a 3D memory device having a pocket structure in a memory string, according to some embodiments of the present disclosure. Examples of the 3D memory device depicted in FIGS. 3A-3L and 4A-4B include 3D memory device 200 depicted in FIG. 2. FIGS. 3A-3L and 4A-4B will be described together. It is understood that the operations shown in method 400 are not exhaustive and that other operations can be performed as well before, after, or between any of the illustrated operations. Further, some of the operations may be performed simultaneously, or in a different order than those shown in FIGS. 4A-4B.

Referring to FIG. 4A, method 400 starts at operation 402, in which a selective epitaxial sacrificial layer is formed above a substrate, and a dielectric stack is formed above the selective epitaxial sacrificial layer. The substrate can be a silicon substrate. The selective epitaxial sacrificial layer can be a polysilicon substrate. The dielectric stack can include a plurality of interleaved sacrificial layers and dielectric layers.

Figure 3A:
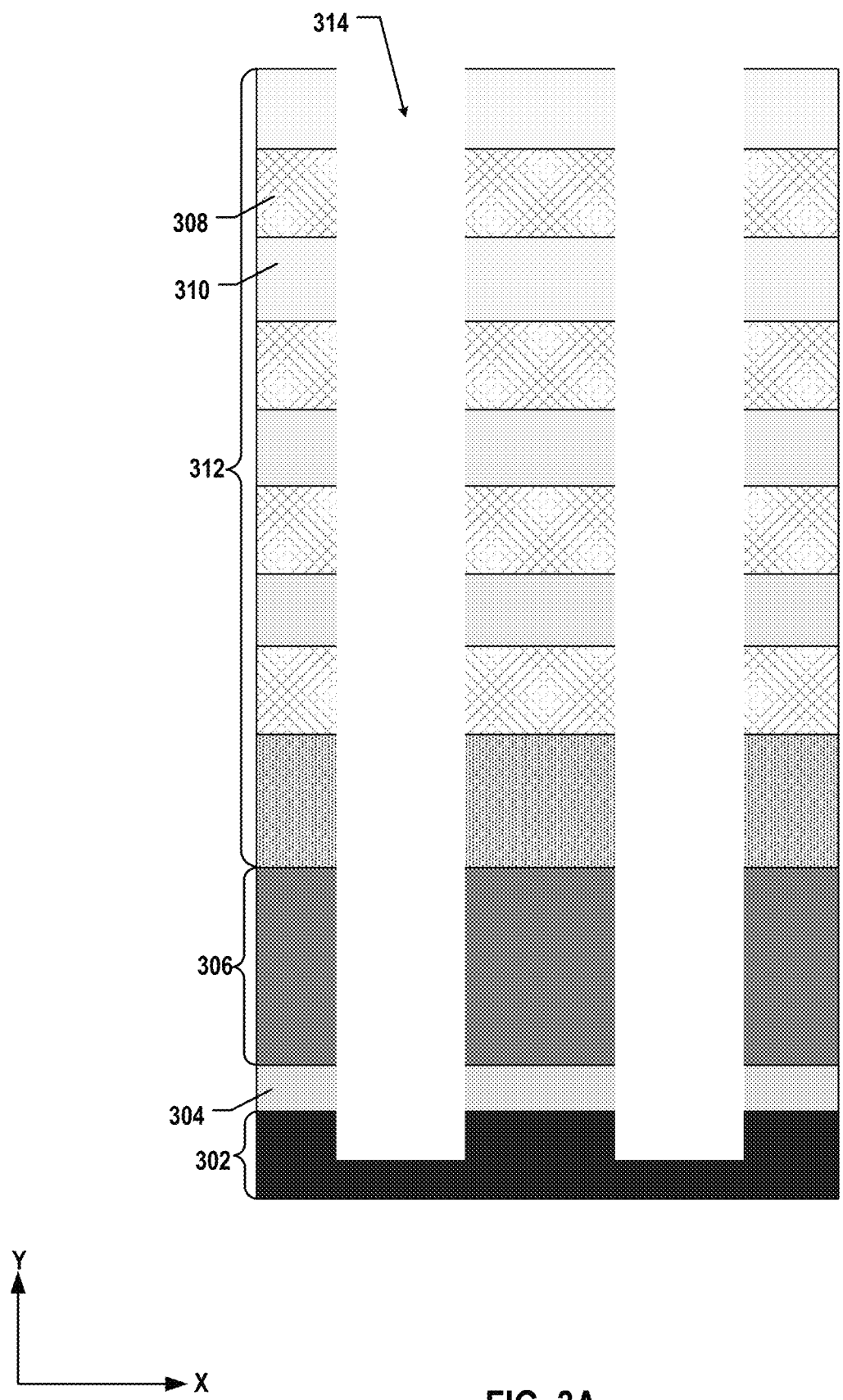
FIGS. 3A-3L illustrate an exemplary fabrication process for forming a 3D memory device having a pocket structure in a memory string, according to some embodiments of the present disclosure.
Figure 4A:
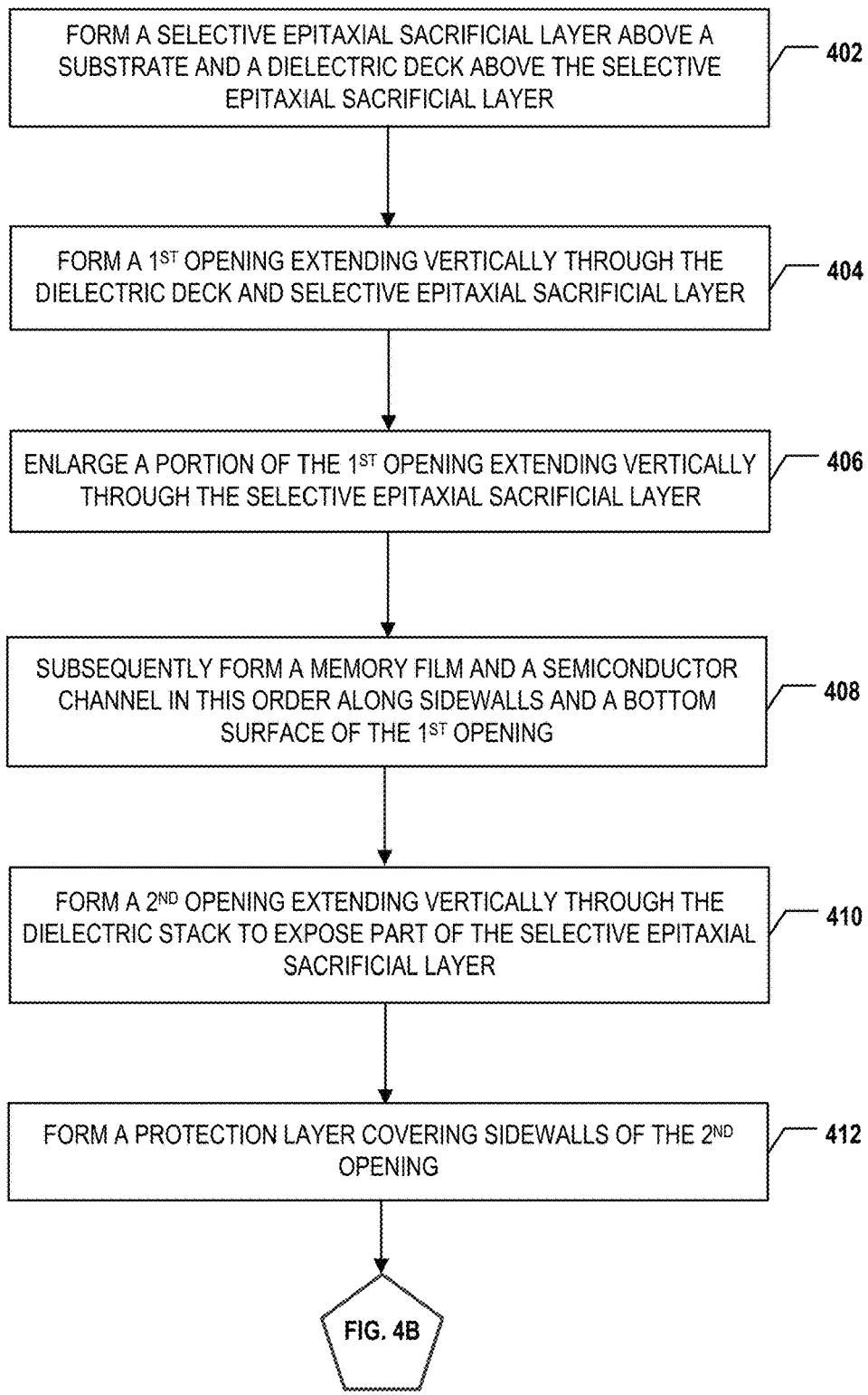
FIGS. 4A-4B illustrate a flowchart of an exemplary method for forming a 3D memory device having a pocket structure in a memory string, according to some embodiments of the present disclosure.
Figure 4B:
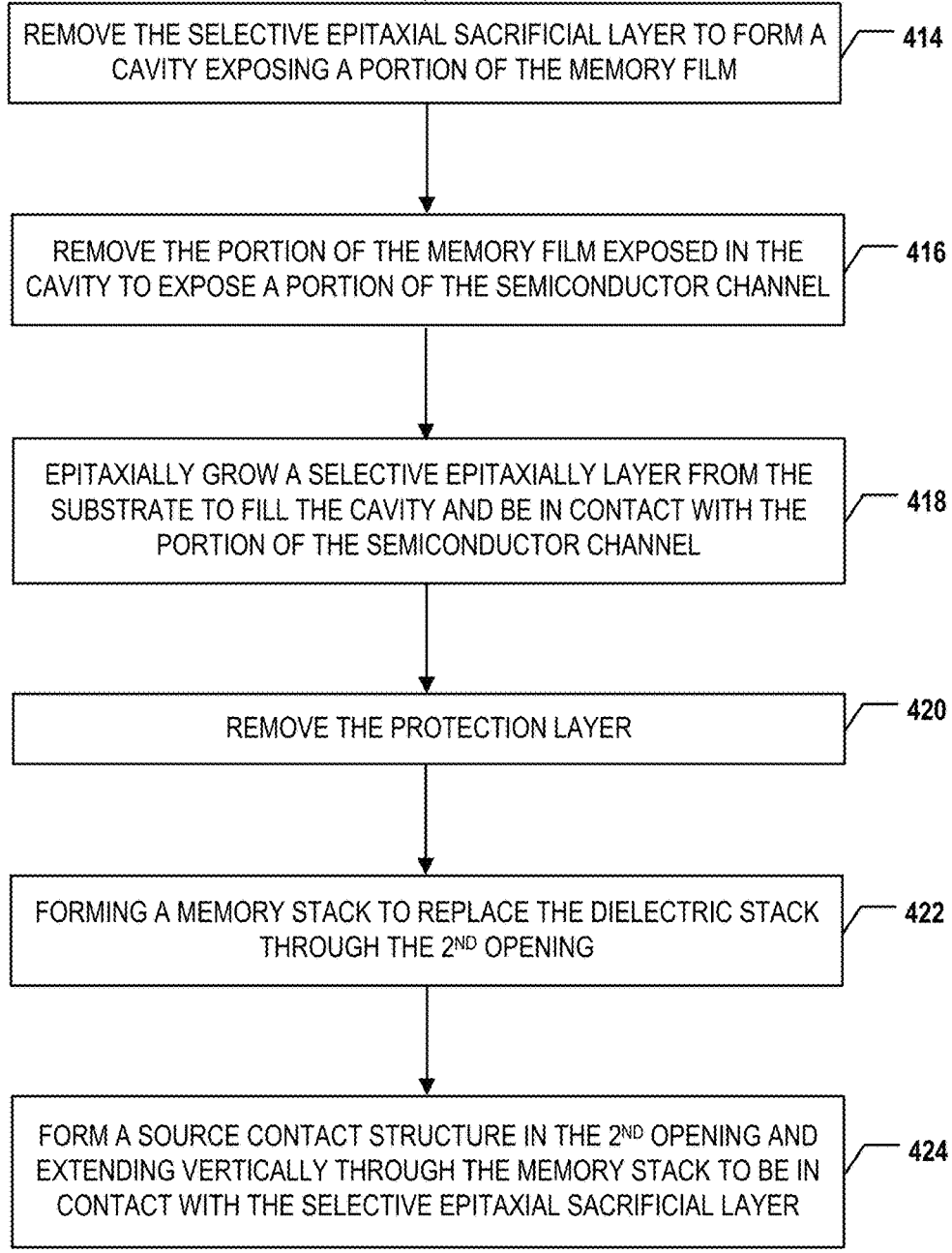

As illustrated in FIG. 3A, a selective epitaxial sacrificial layer 306 is formed above a silicon substrate 302. Selective epitaxial sacrificial layer 306 can be formed by depositing polysilicon or any other suitable sacrificial material (e.g., carbon) that can be later selectively removed using one or more thin film deposition processes including, but not limited to, chemical vapor deposition (CVD), physical vapor deposition (PVD), atomic layer deposition (ALD), or any combination thereof. In some embodiments, a pad oxide layer 304 is formed between selective epitaxial sacrificial layer 306 and silicon substrate 302 by depositing dielectric materials, such as silicon oxide, or thermal oxidation, on silicon substrate 302 prior to the formation of selective epitaxial sacrificial layer 306. A dielectric stack 312 including a plurality pairs of a first dielectric layer (known as a "gate sacrificial layer 308") and a second dielectric layer 310 (together referred to herein as "dielectric layer pairs") is formed on selective epitaxial sacrificial layer 306. Dielectric stack 312 includes interleaved gate sacrificial layers 308 and dielectric layers 310, according to some embodiments. Dielectric layers 310 and gate sacrificial layers 308 can be alternatively deposited on selective epitaxial sacrificial layer 306 above silicon substrate 302 to form dielectric stack 312. In some embodiments, each dielectric layer 310 includes a layer of silicon oxide, and each gate sacrificial layer 308 includes a layer of silicon nitride. Dielectric stack 312 can be formed by one or more thin film deposition processes including, but not limited to, CVD, PVD, ALD, or any combination thereof.

Method 400 proceeds to operation 404, as illustrated in FIG. 4A, in which a first opening extending vertically through the dielectric stack and the selective epitaxial sacrificial layer is formed. As illustrated in FIG. 3A, a channel hole 314 is an opening formed extending vertically through dielectric stack 312 and selective epitaxial sacrificial layer 306. In some embodiments, a plurality of openings are formed through dielectric stack 312 and selective epitaxial sacrificial layer 306, such that each opening becomes the location for growing an individual NAND memory string in the later process. In some embodiments, fabrication processes for forming channel hole 314 include wet etching and/or dry etching, such as deep-ion reactive etching (DRIE). In some embodiments, channel hole 314 extends further through pad oxide layer 304 and into the top portion of silicon substrate 302. The etching process through dielectric stack 312, selective epitaxial sacrificial layer 306, and pad oxide layer 304 may not stop at the top surface of silicon substrate 302 and may continue to etch part of silicon substrate 302. In some embodiments, a separate etching process is used to etch part of silicon substrate 302 after etching through dielectric stack 312, selective epitaxial sacrificial layer 306, and pad oxide layer 304.

Figure 3B:
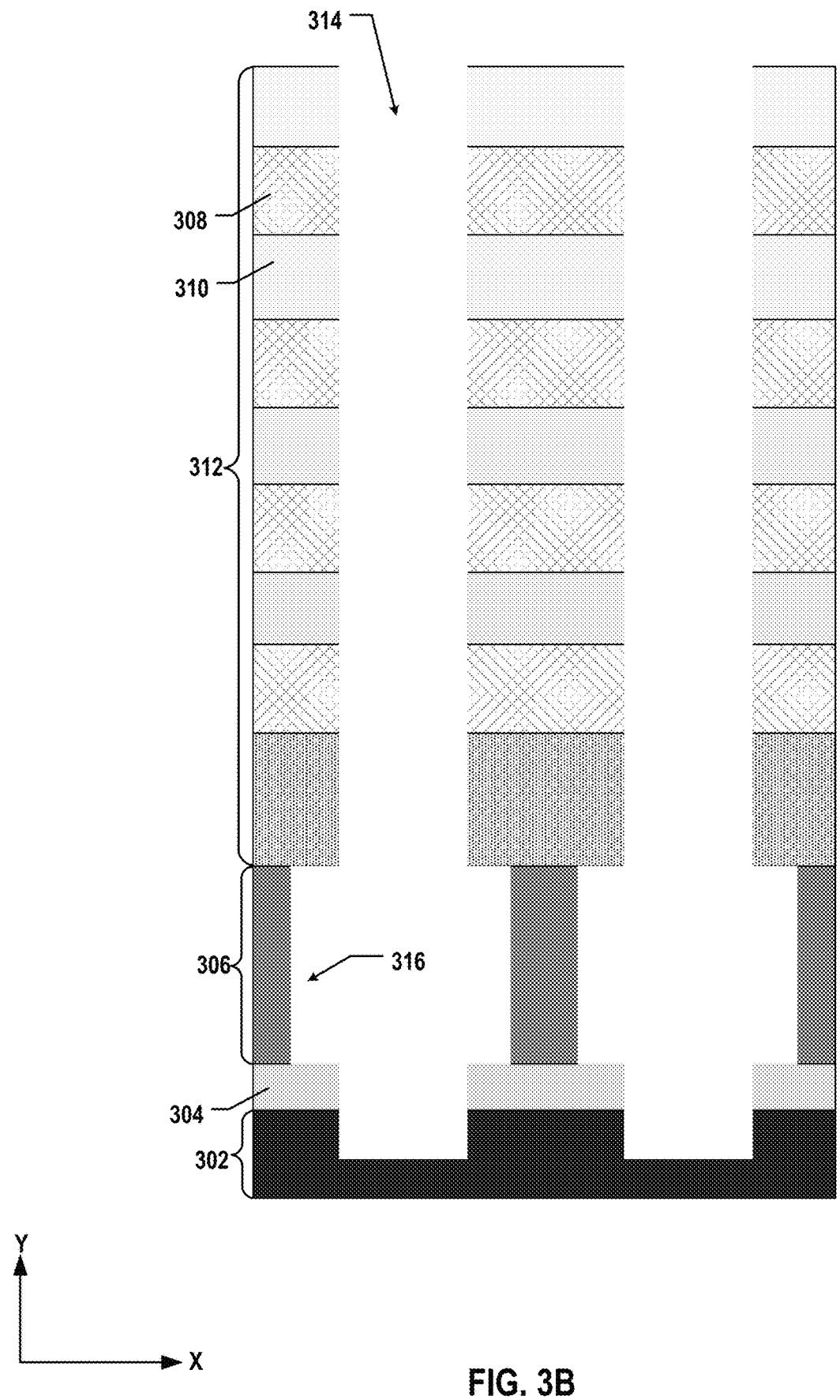

Method 400 proceeds to operation 406, as illustrated in FIG. 4A, in which a portion of the first opening extending vertically through the selective epitaxial sacrificial layer is enlarged. In some embodiments, to enlarge the portion of the first opening, the selective epitaxial sacrificial layer is etched back through the first opening. As illustrated in FIG. 3B, a portion 316 of channel hole 314 that extends vertically through selective epitaxial sacrificial layer 306 is enlarged. For example, the diameter of part of channel hole 314 passing through selective epitaxial sacrificial layer 306 may be increased by etching back part of selective epitaxial sacrificial layer 306 surrounding channel hole 314. The etching back can be performed by wet etching and/or dry etching, such as applying wet etching etchant through channel hole 314. In one example, tetramethylammonium hydroxide (TMAH) may be applied through channel hole 314 to etch selective epitaxial sacrificial layer 306 including polysilicon. The degree of enlargement, i.e., the amount of etched selective epitaxial sacrificial layer 306, can be controlled by controlling the etching conditions, e.g., etchant concentration, temperature, duration, etc.

Method 400 proceeds to operation 408, as illustrated in FIG. 4A, in which a memory film and a semiconductor channel are subsequently formed in this order along sidewalls and a bottom surface of the first opening. In some embodiments, to form the memory film, a first silicon oxide layer, a silicon nitride layer, and a second silicon oxide layer are subsequently deposited in this order on the sidewalls and the bottom surface of the first opening. In some embodiments, to form the semiconductor channel, a polysilicon layer is deposited over the second silicon oxide layer. The first silicon oxide layer, the silicon nitride layer, the second silicon oxide layer, and the polysilicon layer extend laterally in the enlarged portion of the first opening, according to some embodiments.

Figure 3C:
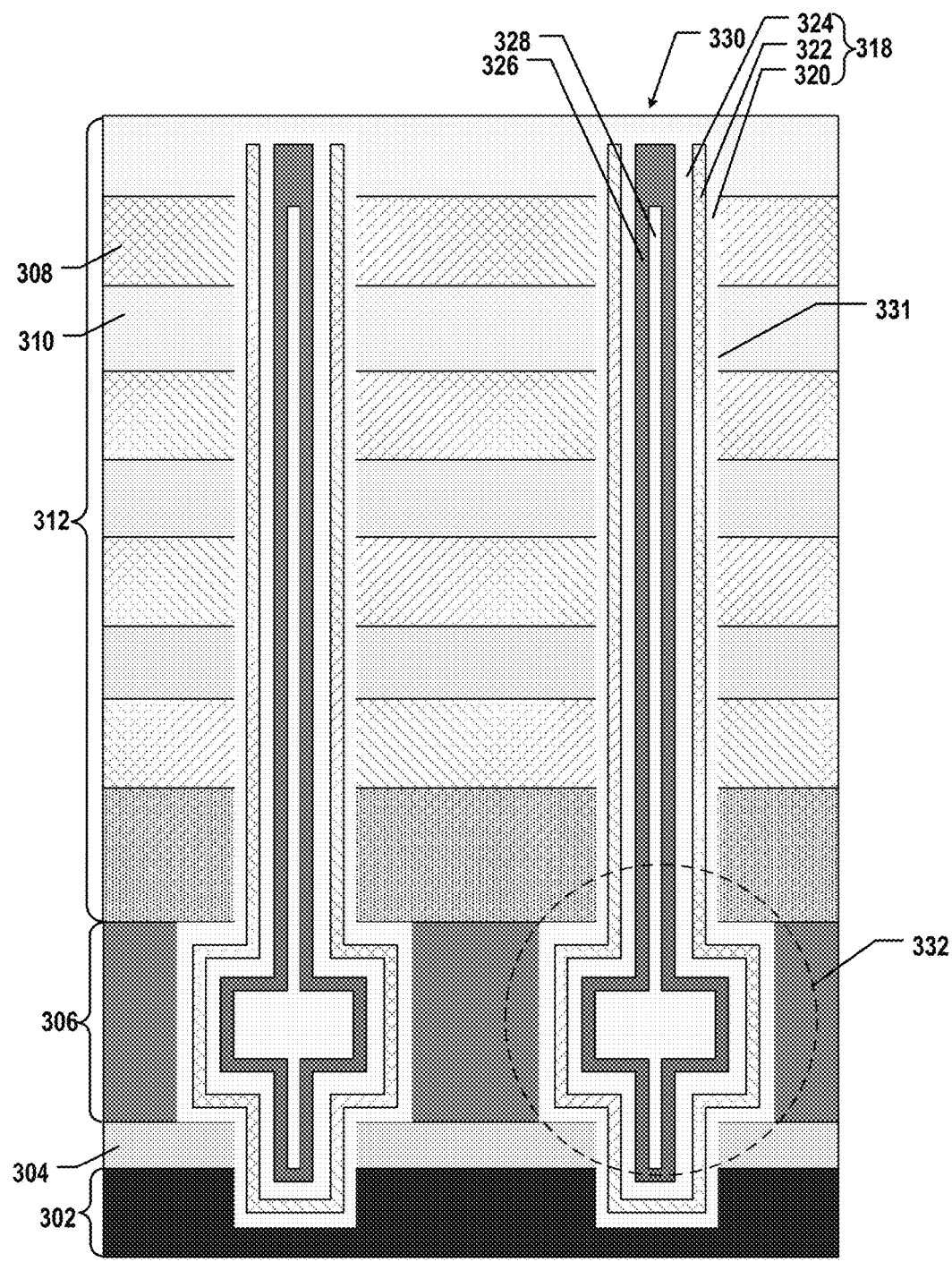

As illustrated in FIG. 3C, a memory film 318 (including a blocking layer 320, a storage layer 322, and a tunneling layer 324) and a semiconductor channel 326 are subsequently formed in this order along sidewalls and the bottom surface of channel hole 314 (as shown in FIG. 3B). In some embodiments, memory film 318 is first deposited along the sidewalls and bottom surface of channel hole 314, and semiconductor channel 326 is then deposited over memory film 318. Blocking layer 320, storage layer 322, and tunneling layer 324 can be subsequently deposited in this order using one or more thin film deposition processes, such as ALD, CVD, PVD, any other suitable processes, or any combination thereof, to form memory film 318. Semiconductor channel 326 can then be formed by depositing a semiconductor material, such as polysilicon, on tunneling layer 324 of memory film 318 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 318 and semiconductor channel 326.

As shown in FIG. 3C, a cap layer 328 is formed in channel hole 314 (shown in FIG. 3B) and over semiconductor channel 326 to completely or partially fill channel hole 314 (e.g., without or with an air gap). Cap layer 328 can be formed by depositing a dielectric material, such as silicon oxide, using one or more thin film deposition processes, such as ALD, CVD, PVD, any other suitable processes, or any combination thereof. A NAND memory string 330 including a channel structure 331 extending vertically in dielectric stack 312 (later replaced by a memory stack) and a pocket structure 332 extending vertically in selective epitaxial sacrificial layer 306 (later replaced by a selective epitaxial layer) is thereby formed.

As shown in FIG. 3C, memory film 318, semiconductor channel 326, and cap layer 328 can be deposited along the sidewalls of enlarged portion 316 of channel hole 314 (as shown in FIG. 3B) as well to form pocket structure 332. In some embodiments, each of blocking layer 320, storage layer 322, tunneling layer 324, semiconductor channel 326, and cap layer 328 is deposited using ALD to control the thickness of each layer, such that each layer follows the sidewall profile of channel hole 314, including enlarged portion 316 thereof. As a result, blocking layer 320 (e.g., including a first silicon oxide layer), storage layer 322 (e.g., including a silicon nitride layer), tunneling layer 324 (e.g., including a second silicon oxide layer), and semiconductor channel 326 (e.g., including a polysilicon layer) extend laterally in enlarged portion 316 of channel hole 314, according to some embodiments. In some embodiments, channel hole 314 is etched back in FIG. 3B for a distance that is nominally the same as the thickness of memory film 318 (i.e., the total thickness of blocking layer 320, storage layer 322, and tunneling layer 324). For example, the thickness of each of memory film 318 and the etched-back distance of enlarged portion 316 is about 20 nm.

Figure 3D:
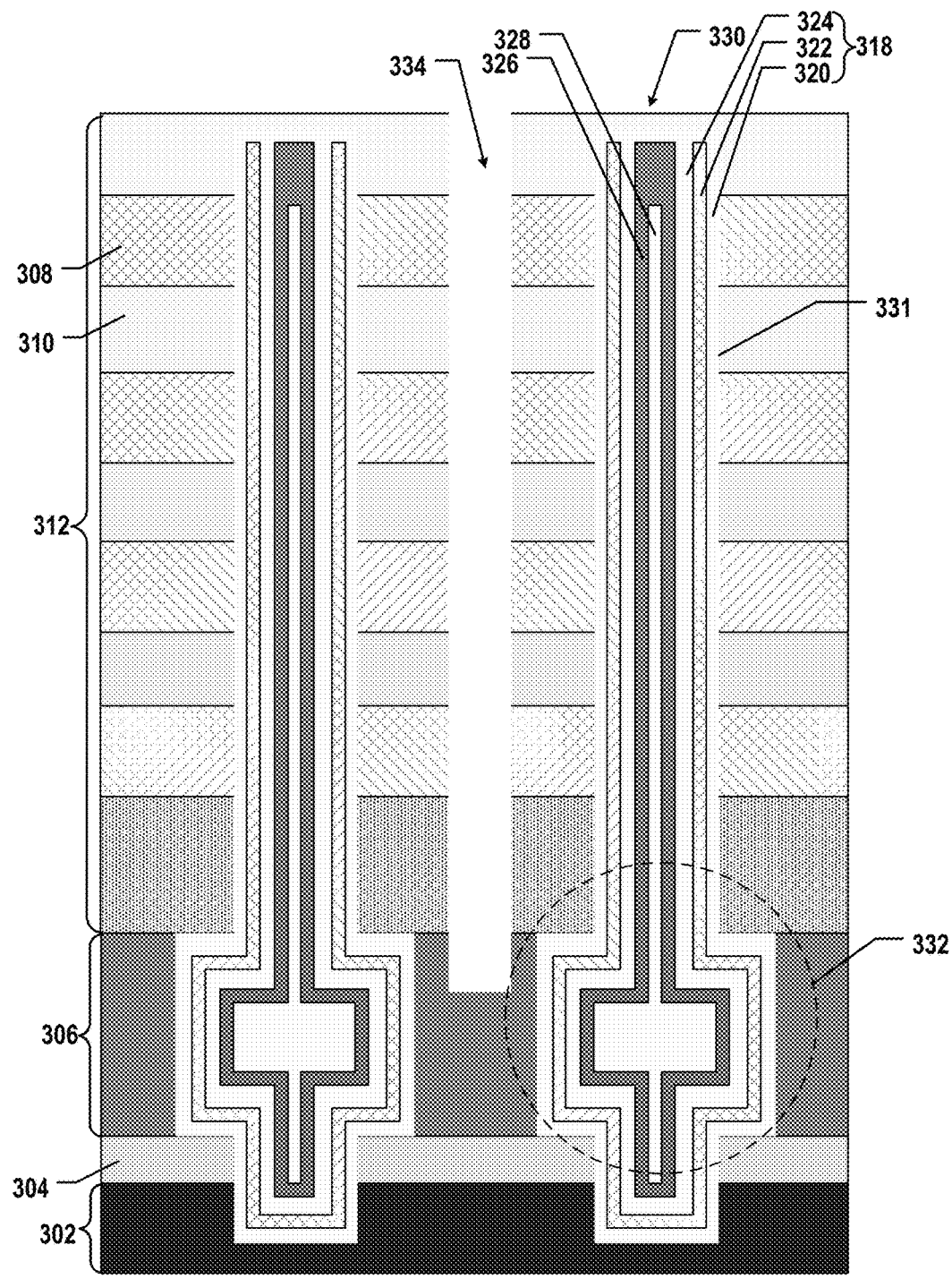

Method 400 proceeds to operation 410, as illustrated in FIG. 4A, in which a second opening extending vertically through the dielectric stack is formed to expose part of the selective epitaxial sacrificial layer. As illustrated in FIG. 3D, a slit 334 is an opening formed that extends vertically through dielectric stack 312 and exposes part of selective epitaxial sacrificial layer 306. In some embodiments, fabrication processes for forming slit 334 include wet etching and/or dry etching, such as DRIE. In some embodiments, slit 334 extends further into the top portion of selective epitaxial sacrificial layer 306. The etching process through dielectric stack 312 may not stop at the top surface of selective epitaxial sacrificial layer 306 and may continue to etch part of selective epitaxial sacrificial layer 306. In some embodiments, a separate etching process is used to etch part of selective epitaxial sacrificial layer 306 after etching through dielectric stack 312.

Method 400 proceeds to operation 412, as illustrated in FIG. 4A, in which a protection layer covering sidewalls of the second opening is formed. In some embodiments, to form the protection layer, a high-k dielectric layer is formed on the sidewalls and a bottom surface of the second opening, and part of the high-k dielectric layer on the bottom surface of the second opening is etched to expose the part of the selective epitaxial sacrificial layer.

Figure 3E:
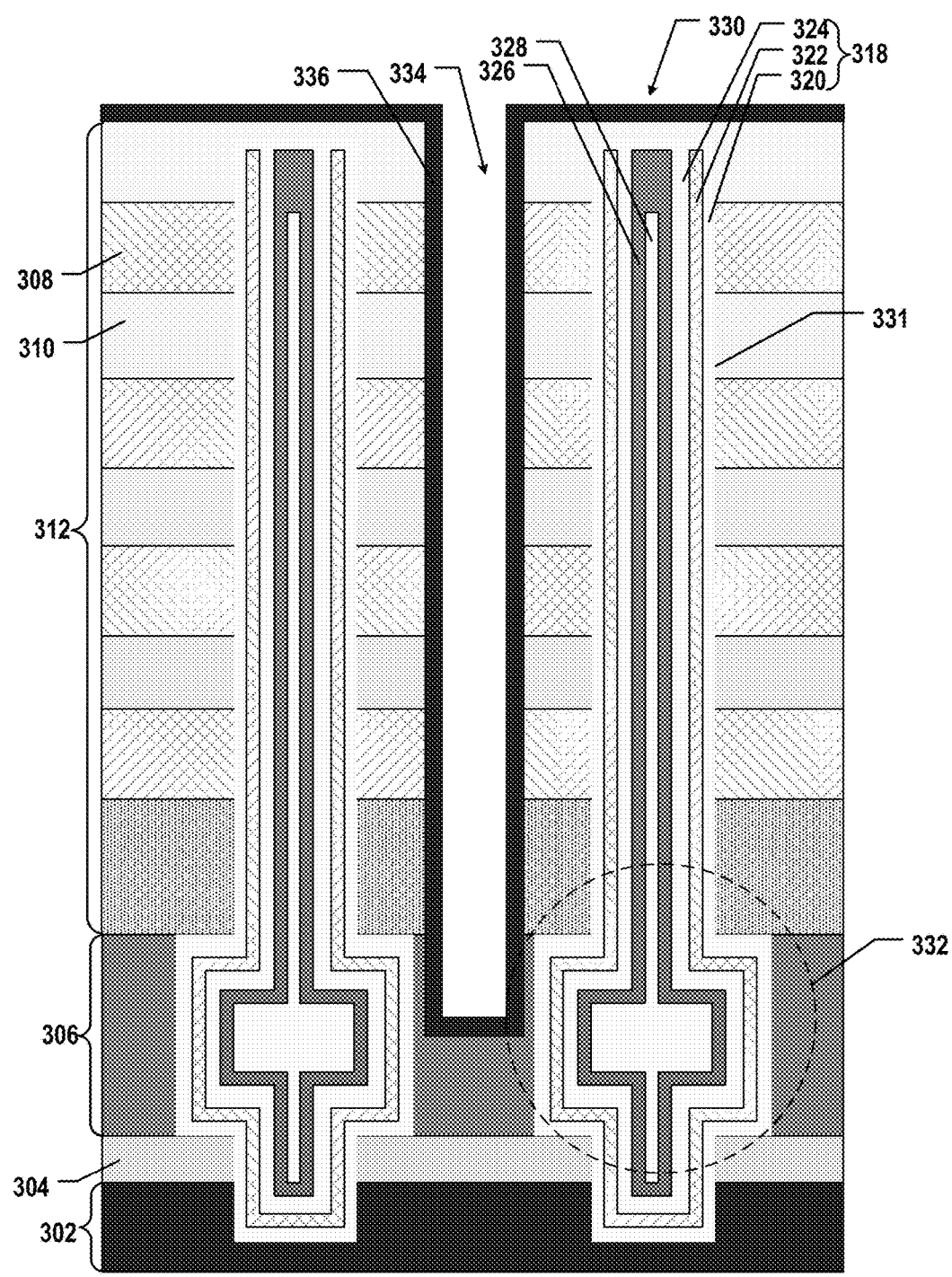

As illustrated in FIG. 3E, a protection layer 336 is formed along the sidewalls and the bottom surface of slit 334. In some embodiments, protection layer 336 is formed on dielectric stack 312 as well. Protection layer 336 can be formed by depositing a high-k dielectric layer (e.g., aluminum oxide) or any other sacrificial material that is to be removed later on the sidewalls and the bottom surface of slit 334 using one or more thin film deposition processes, such as PVD, CVD, ALD, or any combinations thereof. In one example, protection layer 336 may be deposited using ALD. The material of protection layer 336 may be any suitable sacrificial material that is different from the material of selective epitaxial sacrificial layer 306 (e.g., polysilicon) as well as the materials of memory film 318 (e.g., silicon oxide and silicon nitride), such that protection layer 336 can sustain during the removal of selective epitaxial sacrificial layer 306 and part of memory film 318 in pocket structure 332 to protect dielectric stack 312.

Figure 3F:
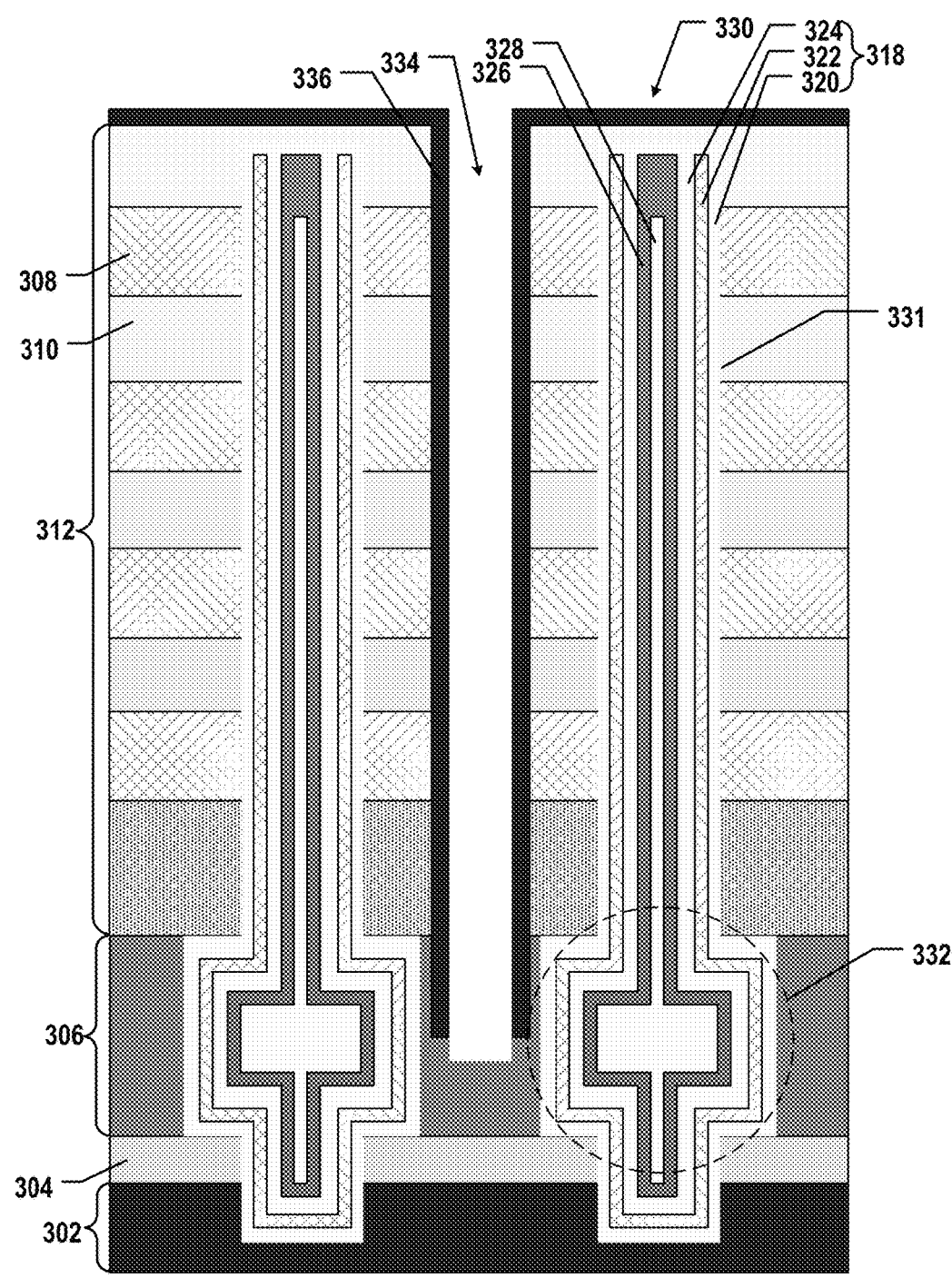

As illustrated in FIG. 3F, part of protection layer 336 at the bottom surface of slit 334 is removed to expose part of selective epitaxial sacrificial layer 306 using dry etching and/or wet etching. As a result, protection layer 336 covers the sidewalls of slit 334, but not the entire bottom surface of slit 334 for lateral processes, according to some embodiments.

Figure 3G:
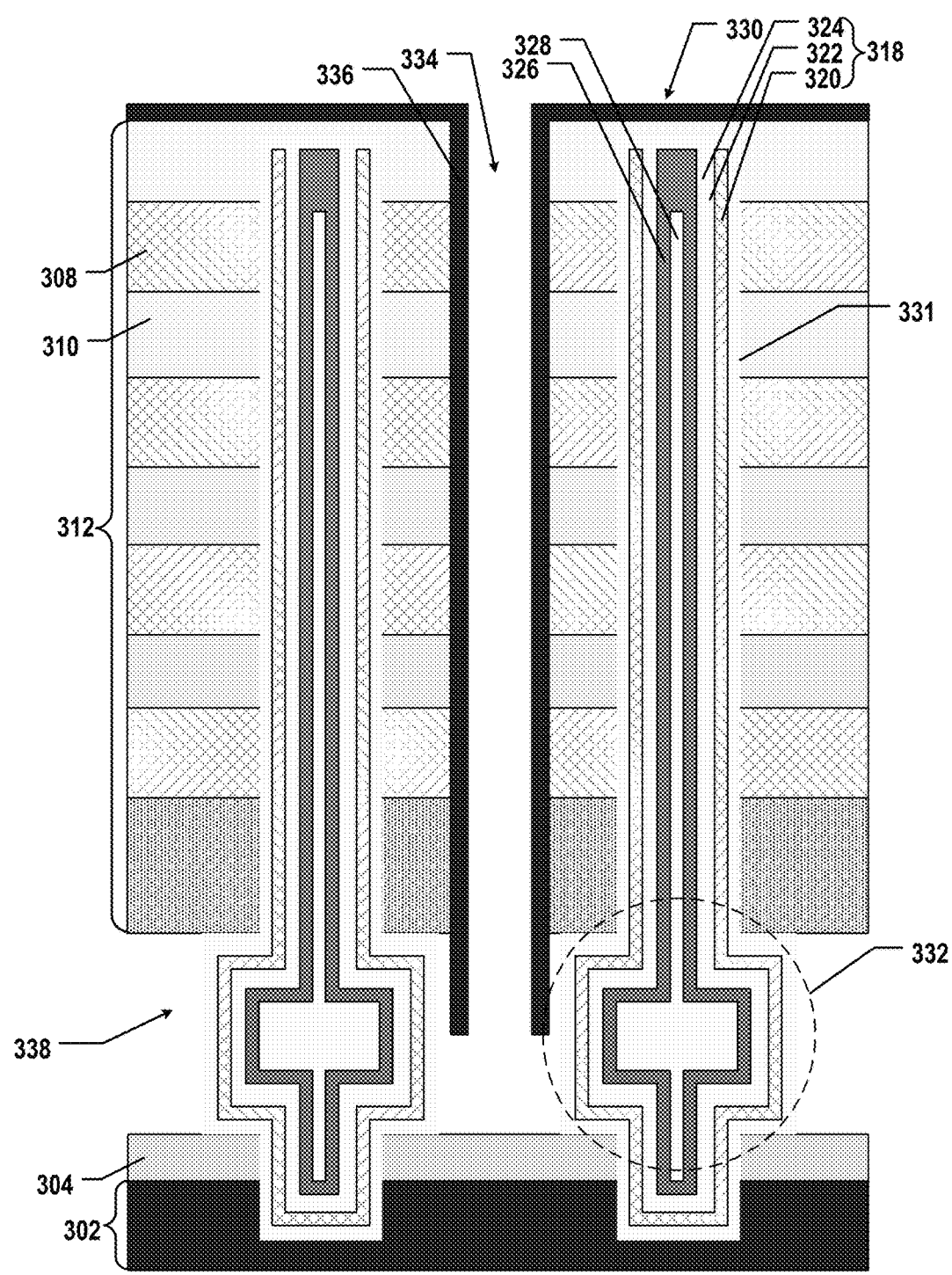

Method 400 proceeds to operation 414, as illustrated in FIG. 4B, in which the selective epitaxial sacrificial layer is removed to form a cavity exposing a portion of the memory film. In some embodiments, to remove the selective epitaxial sacrificial layer, the selective epitaxial sacrificial layer is etched through the second opening. As illustrated in FIG. 3G, selective epitaxial sacrificial layer 306 (shown in FIG. 3F) is removed by wet etching and/or dry etching to form a cavity 338. In some embodiments, selective epitaxial sacrificial layer 306 includes polysilicon, protection layer 336 includes a high-k dielectric material, and selective epitaxial sacrificial layer 306 is etched by applying TMAH etchant through slit 334, which can be stopped by the high-k dielectric material of protection layer 336 as well as the dielectric materials of memory film 318 in pocket structure 332. That is, the removal of selective epitaxial sacrificial layer 306 does not remove dielectric stack 312 and pocket structure 332 of NAND memory string 330, according to some embodiments. Pocket structure 332, due to its enlarged dimension and distinct shapes of memory film 318, semiconductor channel 326, and cap layer 328 therein, can provide enhanced mechanical supports to the upper structures even after the removal of selective epitaxial sacrificial layer 306, as shown in FIG. 3G.

Figure 3H:
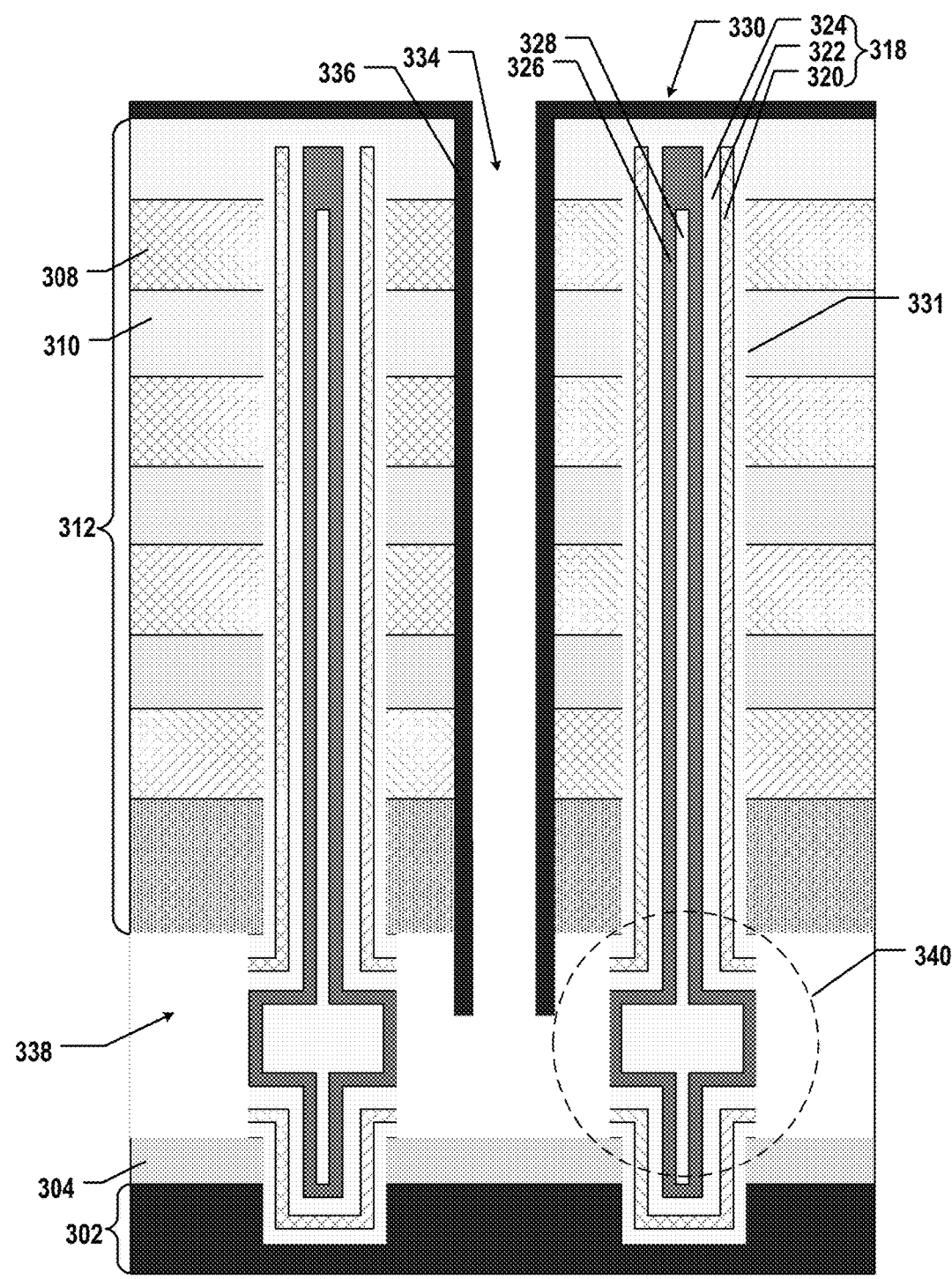

Method 400 proceeds to operation 416, as illustrated in FIG. 4B, in which the portion of the memory film exposed in the cavity is removed to expose a portion of the semiconductor channel. In some embodiments, to remove the portion of the memory film exposed in the cavity, the portion of the memory film is etched until being stopped by the portion of the semiconductor channel. As illustrated in FIG. 3H, part of memory film 318 exposed in cavity 338 (as shown in FIG. 3G) is removed to expose part of semiconductor channel 326 in a pocket structure 340. In some embodiments, parts of blocking layer 320 (e.g., including silicon oxide), storage layer 322 (e.g., including silicon nitride), and tunneling layer (e.g., including silicon oxide) are etched by applying etchants through slit 334 and cavity 338, for example, phosphoric acid for etching silicon nitride and hydrofluoric acid for etching silicon oxide. The etching can be stopped by protection layer 336 and semiconductor channel 326. That is, the removal of part of memory film 318 exposed in cavity 338 does not remove dielectric stack 312 (protected by protection layer 336) and pocket structure 340 (e.g., semiconductor channel 326 including polysilicon and cap layer 328 enclosed by semiconductor channel 326) of NAND memory string 330, according to some embodiments. Pocket structure 340, due to its enlarged dimension and distinct shapes of memory film 318, semiconductor channel 326, and cap layer 328 therein, can provide enhanced mechanical supports to the upper structures even after the removal of part of memory film 318, as shown in FIG. 3H.

Figure 3I:
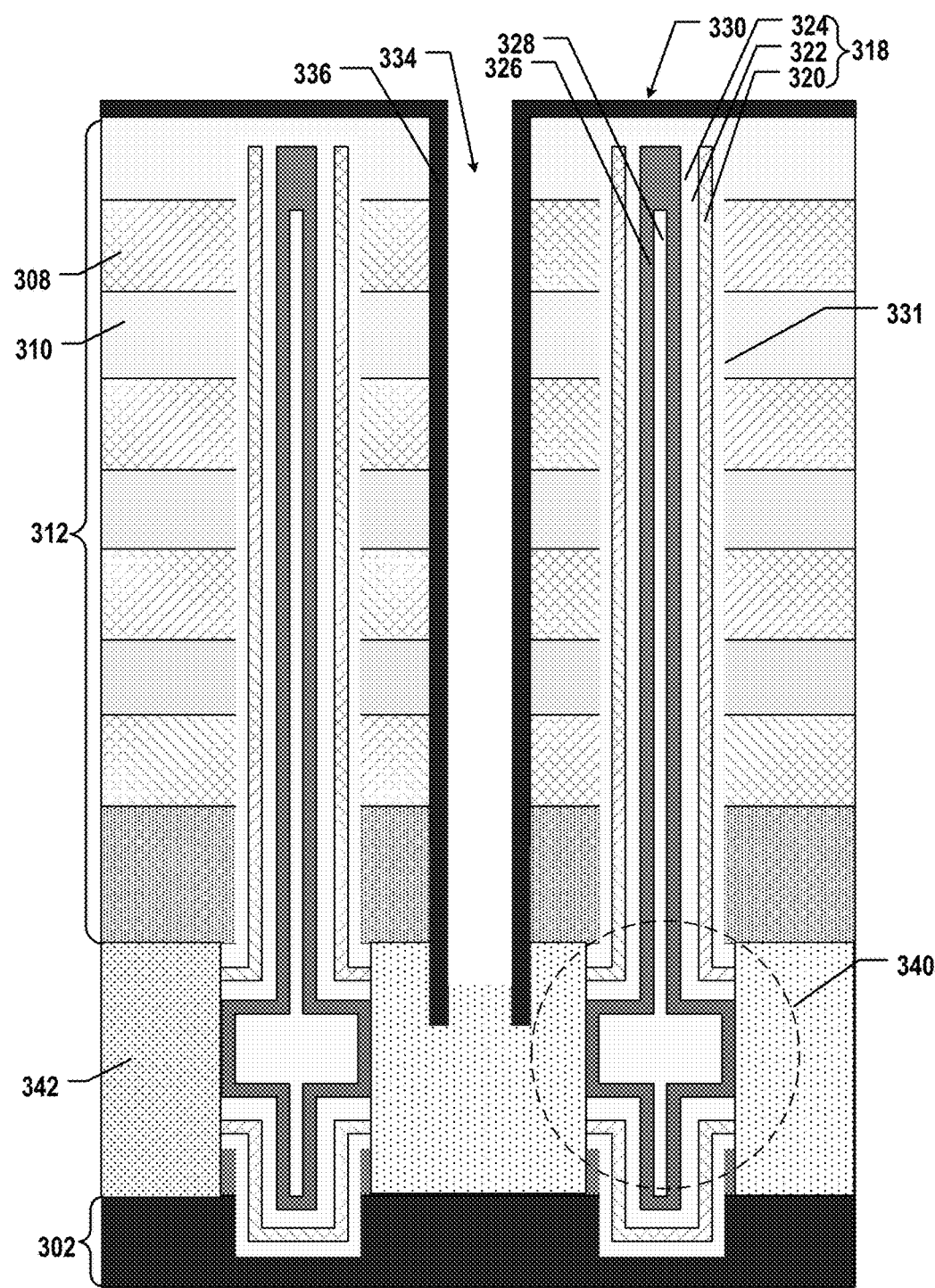

Method 400 proceeds to operation 418, as illustrated in FIG. 4B, in which a selective epitaxial layer is epitaxially grown from the substrate to fill the cavity and be in contact with the portion of the semiconductor channel. As illustrated in FIG. 3I, a selective epitaxial layer 342 is formed by selectively filling cavity 338 (as shown in FIG. 3H) with single crystalline silicon epitaxially grown upwards from silicon substrate 302. The fabrication processes for epitaxially growing selective epitaxial layer 342 can include pre-cleaning cavity 338 followed by, for example, vapor-phase epitaxy (VPE), liquid-phase epitaxy (LPE), molecular-beam epitaxy (MPE), or any combinations thereof. Selective epitaxial layer 342 can be in contact with the sidewalls of the part of semiconductor channel 326 in pocket structure 340 of NAND memory string 330.

Figure 3J:
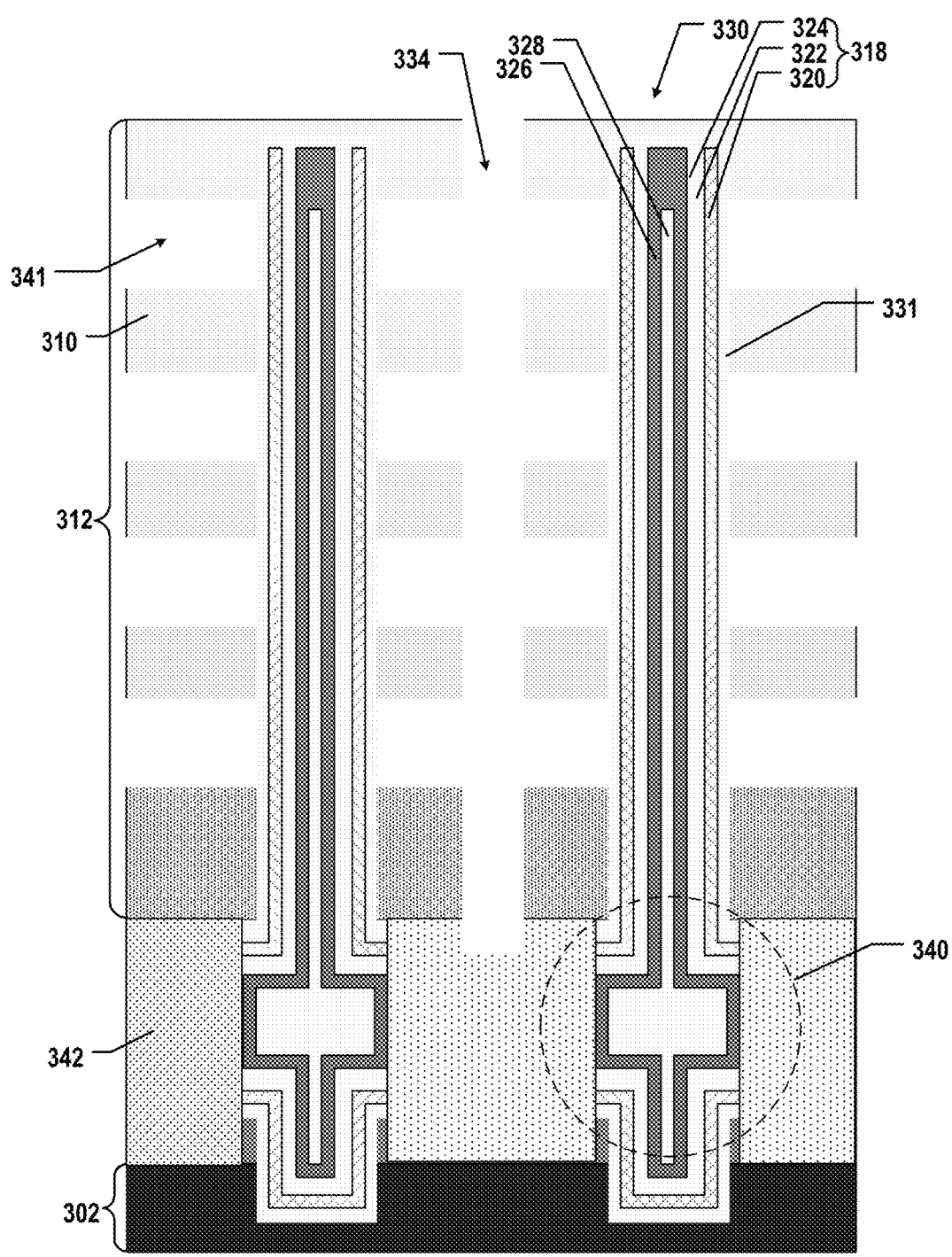

Method 400 proceeds to operation 420, as illustrated in FIG. 4B, in which the protection layer is removed. As illustrated in FIG. 3J, protection layer 336 (as shown in FIG. 3I) covering the sidewalls of slit 334 is removed using wet etching and/or dry etching to expose gate sacrificial layers 308 (as shown in FIG. 3I) of dielectric stack 312 from slit 334 for later processes.

Figure 3K:
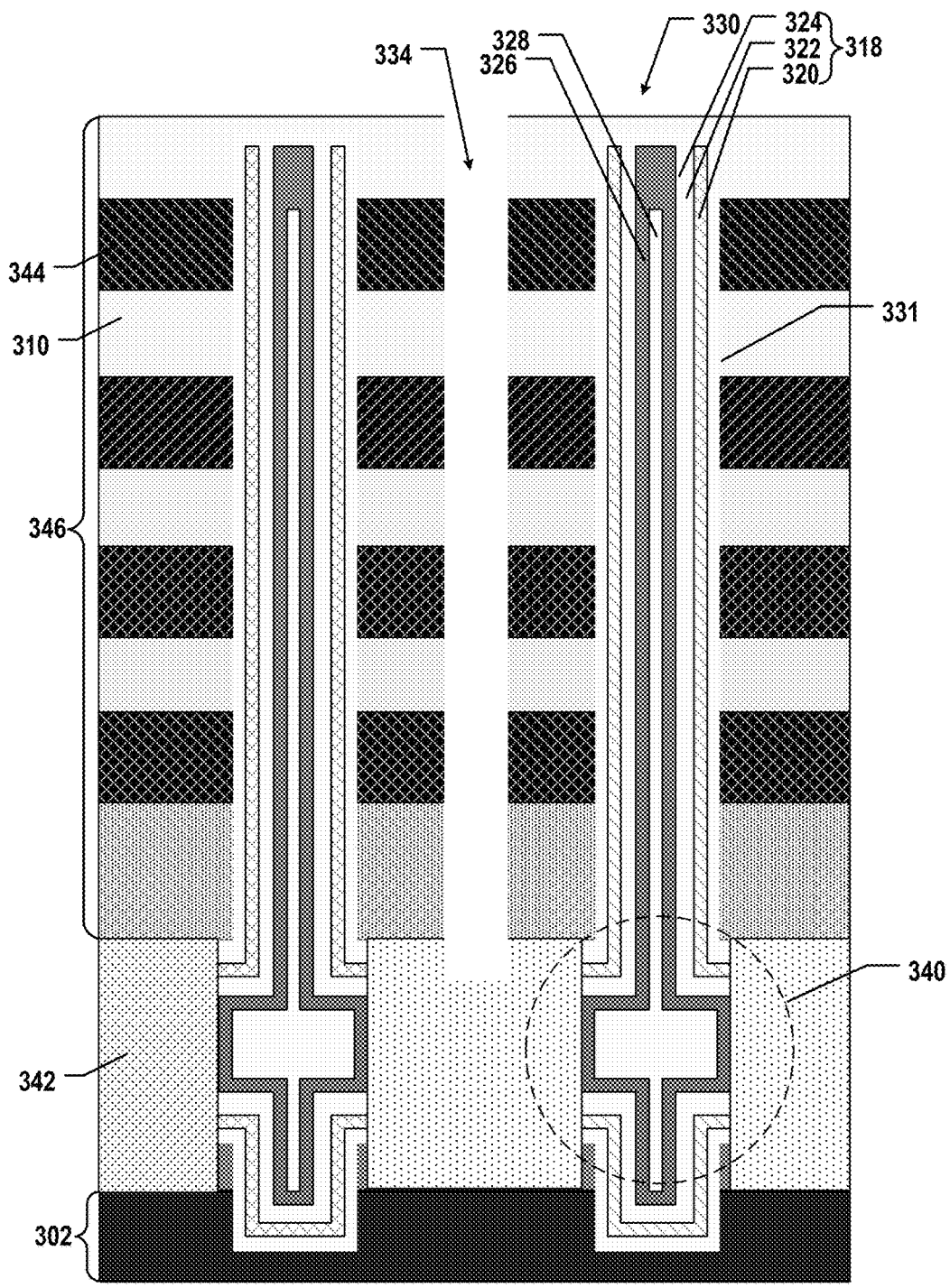

Method 400 proceeds to operation 422, as illustrated in FIG. 4B, in which a memory stack is formed to replace the dielectric stack through the second opening. As illustrated in FIGS. 3J and 3K, after the removal of protection layer 336, a memory stack 346 can be formed by a gate replacement process, i.e., replacing gate sacrificial layers 308 (as shown in FIG. 3I) with conductive layers 344. Memory stack 346 thus can include interleaved conductive layers 344 and dielectric layers 310 on selective epitaxial layer 342 above silicon substrate 302. As illustrated in FIG. 3J, to form memory stack 346, gate sacrificial layers 308 (as shown in FIG. 3I) are removed by applying etchants through slit 334 to form a plurality of lateral recesses 341. As illustrated in FIG. 3K, conductive layers 344 can be deposited into lateral recesses 341 using one or more thin film deposition processes, such as PVD, CVD, ALD, or any combinations thereof.

Figure 3L:
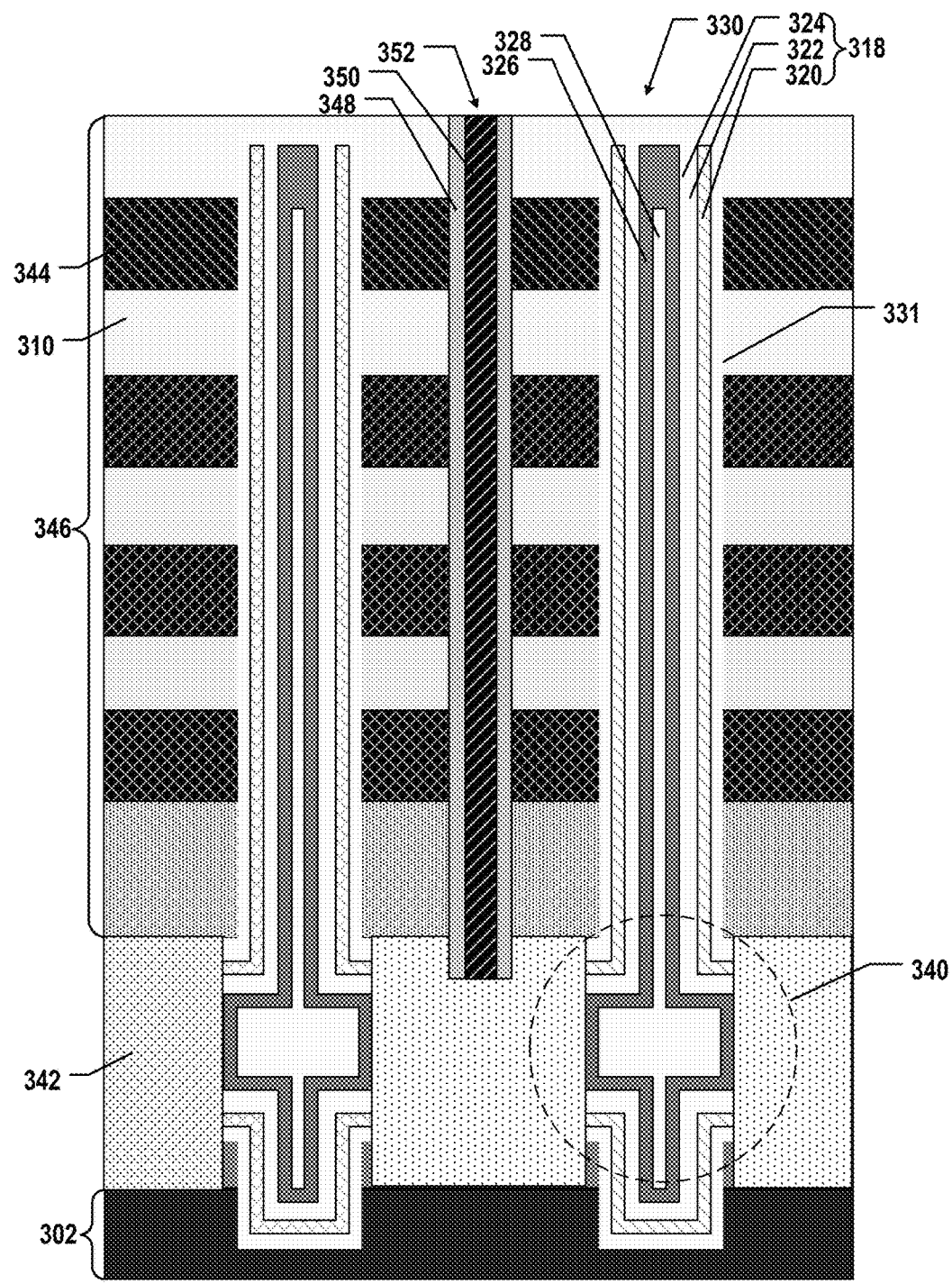

Method 400 proceeds to operation 424, as illustrated in FIG. 4B, in which a source contact structure is formed in the second opening and extending vertically through the memory stack to be in contact with the selective epitaxial sacrificial layer. As illustrated in FIG. 3K, a source contact structure 352 including a source conductor 350 and a spacer 348 surrounding source conductor 350 is formed in slit 334 (as shown in FIG. 3K). In some embodiments, spacer 348 including a dielectric material, such as silicon oxide, and source conductor 350 including one or more conductive materials, such as polysilicon and tungsten, are subsequently deposited in this order into slit 334 using one or more thin film deposition processes, such as PVD, CVD, ALD, electroplating, electroless plating, or any combinations thereof, to fill slit 334. Source contact structure 352 can be in contact with selective epitaxial layer 342, as shown in FIG. 3L.

According to one aspect of the present disclosure, a 3D memory device includes a substrate, a selective epitaxial layer on the substrate, a memory stack including interleaved conductive layers and dielectric layers on the selective epitaxial layer, and a memory string including a channel structure extending vertically in the memory stack and a pocket structure extending vertically in the selective epitaxial layer. The memory string includes a semiconductor channel extending vertically in the channel structure, and extending vertically and laterally in the pocket structure and in contact with the selective epitaxial layer.

In some embodiments, a lateral dimension of the channel structure is not greater than a lateral dimension of the pocket structure. In some embodiments, the lateral dimension of the channel structure is the same as the lateral dimension of the pocket structure.

In some embodiments, the memory string includes a memory film laterally between the memory stack and the semiconductor channel in the channel structure, the memory film extending vertically in the channel structure and extending laterally in the pocket structure. In some embodiments, the memory film includes a blocking layer, a storage layer, and a tunneling layer.

In some embodiments, the memory string includes a cap layer surrounded by the semiconductor channel, a lateral dimension of the cap layer in the pocket structure being greater than a lateral dimension of the cap layer in the channel structurer.

In some embodiments, the selective epitaxial layer includes single crystalline silicon, and the semiconductor channel comprises polysilicon.

In some embodiments, the semiconductor channel extends laterally in the pocket structure for about 20 nm.

In some embodiments, the semiconductor channel is flat at a lower end of the memory string.

In some embodiments, the 3D memory device further includes a source contact structure extending vertically through the memory stack and in contact with the selective epitaxial layer.

According to another aspect of the present disclosure, a 3D memory device includes a substrate, a selective epitaxial layer on the substrate, a memory stack including interleaved conductive layers and dielectric layers on the selective epitaxial layer, and a memory string including a channel structure extending vertically in the memory stack and a pocket structure extending vertically in the selective epitaxial layer. A lateral dimension of the channel structure is not greater than a lateral dimension of the pocket structure.

In some embodiments, the lateral dimension of the channel structure is the same as the lateral dimension of the pocket structure.

In some embodiments, the memory string includes a semiconductor channel extending vertically in the channel structure, and extending vertically and laterally in the pocket structure and in contact with the selective epitaxial layer.

In some embodiments, the semiconductor channel extends laterally in the pocket structure for about 20 nm.

In some embodiments, the memory string includes a memory film laterally between the memory stack and the semiconductor channel in the channel structure, the memory film extending vertically in the channel structure and extending laterally in the pocket structure. In some embodiments, the memory film includes a blocking layer, a storage layer, and a tunneling layer.

In some embodiments, the memory string includes a cap layer surrounded by the semiconductor channel, a lateral dimension of the cap layer in the pocket structure being greater than a lateral dimension of the cap layer in the channel structurer.

In some embodiments, the selective epitaxial layer includes single crystalline silicon, and the semiconductor channel comprises polysilicon.

In some embodiments, the semiconductor channel is flat at a lower end of the memory string.

In some embodiments, the 3D memory device further includes a source contact structure extending vertically through the memory stack and in contact with the selective epitaxial layer.

According to still another aspect of the present disclosure, a method for forming a 3D memory device is disclosed. A selective epitaxial sacrificial layer is formed above a substrate, and a dielectric stack is formed above the selective epitaxial sacrificial layer. A first opening extending vertically through the dielectric stack and the selective epitaxial sacrificial layer is formed. A portion of the first opening extending vertically through the selective epitaxial sacrificial layer is enlarged. A memory film and a semiconductor channel are subsequently formed in this order along sidewalls and a bottom surface of the first opening. The selective epitaxial sacrificial layer is removed to form a cavity exposing a portion of the memory film. The portion of the memory film exposed in the cavity is removed to expose a portion of the semiconductor channel. A selective epitaxial layer is epitaxially grown from the substrate to fill the cavity and be in contact with the portion of the semiconductor channel.

In some embodiments, to enlarge the portion of the first opening, the selective epitaxial sacrificial layer is etched back through the first opening.

In some embodiments, to form the memory film, a first silicon oxide layer, a silicon nitride layer, and a second silicon oxide layer are subsequently deposited in this order on the sidewalls and the bottom surface of the first opening, and to form the semiconductor channel a polysilicon layer is deposited over the second silicon oxide layer.

In some embodiments, the first silicon oxide layer, the silicon nitride layer, the second silicon oxide layer, and the polysilicon layer extend laterally in the enlarged portion of the first opening.

In some embodiments, after forming the memory film and the semiconductor channel, a second opening extending vertically through the dielectric stack is formed to expose part of the selective epitaxial sacrificial layer, and a protection layer covering sidewalls of the second opening is formed.

In some embodiments, to form the protection layer, a high-k dielectric layer is formed on the sidewalls and a bottom surface of the second opening, and part of the high-k dielectric layer on the bottom surface of the second opening is etched to expose the part of the selective epitaxial sacrificial layer.

In some embodiments, to remove the selective epitaxial sacrificial layer, the selective epitaxial sacrificial layer is etched through the second opening, and to remove the portion of the memory film exposed in the cavity, the portion of the memory film is etched until being stopped by the portion of the semiconductor channel.

In some embodiments, after epitaxially growing the selective epitaxial layer, the protection layer is removed, and a memory stack is formed to replace the dielectric stack through the second opening.

In some embodiments, a source contact structure is formed in the second opening and extending vertically through the memory stack to be in contact with the selective epitaxial sacrificial layer.

In some embodiments, the substrate is a silicon substrate, and the selective epitaxial layer includes single crystalline silicon.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a selective epitaxial sacrificial layer above a substrate and a dielectric stack above the selective epitaxial sacrificial layer;
    forming a first opening extending vertically through the dielectric stack and the selective epitaxial sacrificial layer;
    enlarging a portion of the first opening extending vertically through the selective epitaxial sacrificial layer;
    subsequently forming a memory film and a semiconductor channel in this order along sidewalls and a bottom surface of the first opening;
    removing the selective epitaxial sacrificial layer to form a cavity exposing a portion of the memory film;
    removing the portion of the memory film exposed in the cavity to expose a portion of the semiconductor channel; and
    epitaxially growing a selective epitaxial layer from the substrate to fill the cavity and be in contact with the portion of the semiconductor channel.

2. The method of claim 1, wherein enlarging the portion of the first opening comprises etching back the selective epitaxial sacrificial layer through the first opening.

3. The method of claim 2, wherein
    forming the memory film comprises subsequently depositing a first silicon oxide layer, a silicon nitride layer, and a second silicon oxide layer in this order on the sidewalls and the bottom surface of the first opening; and forming the semiconductor channel comprises depositing a polysilicon layer over the second silicon oxide layer.

4. The method of claim 3, wherein the first silicon oxide layer, the silicon nitride layer, the second silicon oxide layer, and the polysilicon layer extend laterally in the enlarged portion of the first opening.

5. The method of claim 1, further comprising, after forming the memory film and the semiconductor channel:

forming a second opening extending vertically through the dielectric stack to expose part of the selective epitaxial sacrificial layer; and forming a protection layer covering sidewalls of the second opening.

6. The method of claim 5, wherein forming the protection layer comprises:

depositing a high dielectric constant (high-k) dielectric layer on the sidewalls and a bottom surface of the second opening; and etching part of the high-k dielectric layer on the bottom surface of the second opening to expose the part of the selective epitaxial sacrificial layer.

7. The method of claim 5, wherein removing the selective epitaxial sacrificial layer comprises etching the selective epitaxial sacrificial layer through the second opening; and removing the portion of the memory film exposed in the cavity comprises etching the portion of the memory film until being stopped by the portion of the semiconductor channel.

8. The method of claim 5, further comprising, after epitaxially growing the selective epitaxial layer:

removing the protection layer; and forming a memory stack to replace the dielectric stack through the second opening.

9. The method of claim 8, further comprising forming a source contact structure in the second opening and extending vertically through the memory stack to be in contact with the selective epitaxial sacrificial layer.

10. The method of claim 1, wherein the substrate is a silicon substrate, and the selective epitaxial layer comprises single crystalline silicon.

* * * * *